[12] United States Patent  
Chiu

(10) Patent No.: US 12,336,264 B2  
(45) Date of Patent: Jun. 17, 2025

(54) SEMICONDUCTOR DEVICE HAVING GATE ELECTRODES WITH DOPANT OF DIFFERENT CONDUCTIVE TYPES

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 397 days.

(21) Appl. No.: 17/844,971

(22) Filed: Jun. 21, 2022

(65) Prior Publication Data

US 2023/0411488 A1 Dec. 21, 2023

(51) Int. Cl.
*H10D 84/83* (2025.01)
*H10D 64/66* (2025.01)
*H10D 84/85* (2025.01)
H10D 30/01 (2025.01)
H10D 30/60 (2025.01)
H10D 89/10 (2025.01)

(52) U.S. Cl.
CPC .......... *H10D 64/661* (2025.01); *H10D 84/83* (2025.01); *H10D 30/023* (2025.01); *H10D 30/611* (2025.01); *H10D 84/856* (2025.01); *H10D 89/10* (2025.01)

(58) Field of Classification Search
CPC ......... H01L 21/82345; H01L 21/28105; H01L 29/4983; H01L 29/7856; H01L 29/66484; H01L 29/7831; H01L 29/78645; H01L 29/8124; H01L 27/0207; H01L 27/0922; H10D 30/023; H10D 30/611; H10D 84/83; H10D 84/856; H10D 84/038; H10D 84/014; H10D 64/661

See application file for complete search history.

(56) References Cited

U.S. PATENT DOCUMENTS

| | | | | |
|---|---|---|---|---|
| 4,599,789 A | * | 7/1986 | Gasner | H10D 84/0191 |
| | | | | 438/231 |
| 4,786,611 A | * | 11/1988 | Pfiester | H10D 84/0174 |
| | | | | 438/233 |
| 5,028,564 A | * | 7/1991 | Chang | H01L 21/2255 |
| | | | | 148/DIG. 44 |

(Continued)

FOREIGN PATENT DOCUMENTS

| TW | 200705568 A | 2/2007 |
|---|---|---|
| TW | 200802717 A | 1/2008 |
| TW | 200805574 A | 1/2008 |

OTHER PUBLICATIONS

Office Action and and the search report mailed on Jan. 30, 2024 related to Taiwanese Application No. 112106720.

(Continued)

*Primary Examiner* — Maliheh Malek
(74) *Attorney, Agent, or Firm* — Xuan Zhang

(57) ABSTRACT

A semiconductor device is provided. The semiconductor device includes a substrate, a first gate electrode, and a second gate electrode. The first gate electrode is disposed on the substrate. The first gate electrode has a first dopant of a first conductive type. The second gate electrode is disposed on the substrate. The second gate electrode has a second dopant of a second conductive type different from the first conductive type.

11 Claims, 23 Drawing Sheets

(56) References Cited

U.S. PATENT DOCUMENTS

| | | | | |
|---|---|---|---|---|
| 5,420,447 | A * | 5/1995 | Waggoner | H10D 89/10 |
| | | | | 257/202 |
| 5,576,579 | A * | 11/1996 | Agnello | H10D 64/664 |
| | | | | 257/E29.345 |
| 5,780,883 | A * | 7/1998 | Tran | H10D 84/907 |
| | | | | 257/206 |
| 5,937,289 | A * | 8/1999 | Bronner | H01L 21/28035 |
| | | | | 438/525 |
| 6,008,516 | A * | 12/1999 | Mehrad | H10B 41/10 |
| | | | | 257/318 |
| 6,069,383 | A * | 5/2000 | Yu | H10B 41/10 |
| | | | | 257/E27.103 |
| 6,133,084 | A * | 10/2000 | Chang | H10B 10/12 |
| | | | | 438/528 |
| 6,262,456 | B1 * | 7/2001 | Yu | H10D 64/017 |
| | | | | 257/370 |
| 6,448,590 | B1 * | 9/2002 | Adkisson | H10D 64/661 |
| | | | | 257/390 |
| 6,600,212 | B2 * | 7/2003 | Takayanagi | H10D 84/0174 |
| | | | | 257/407 |
| 6,709,912 | B1 * | 3/2004 | Ang | H10D 84/038 |
| | | | | 438/933 |
| 6,841,813 | B2 * | 1/2005 | Walker | H10B 10/18 |
| | | | | 257/E27.102 |
| 6,861,304 | B2 * | 3/2005 | Hisamoto | H01L 21/2807 |
| | | | | 438/301 |
| 7,372,095 | B2 * | 5/2008 | Vollrath | H10B 69/00 |
| | | | | 257/E29.279 |
| 7,423,310 | B2 * | 9/2008 | Verhoeven | H10D 30/0413 |
| | | | | 257/E21.59 |
| 7,804,143 | B2 * | 9/2010 | Gaul | H10D 62/371 |
| | | | | 257/490 |
| 7,859,026 | B2 * | 12/2010 | Ligon | H01L 21/2815 |
| | | | | 257/E21.375 |
| 7,911,004 | B2 * | 3/2011 | Takahashi | H10D 84/0174 |
| | | | | 257/377 |
| 8,080,847 | B2 * | 12/2011 | Leibiger | H10D 64/519 |
| | | | | 257/E29.264 |
| 8,268,693 | B2 * | 9/2012 | Gaul | H10D 84/0151 |
| | | | | 438/295 |
| 8,698,204 | B2 * | 4/2014 | Kutsukake | H10B 41/35 |
| | | | | 257/314 |
| 9,076,873 | B2 * | 7/2015 | Chen | H10D 30/6739 |
| 9,397,174 | B2 * | 7/2016 | Ellis-Monaghan | |
| | | | | H10D 84/0177 |
| 10,607,557 | B2 * | 3/2020 | Zhao | G02F 1/136286 |
| 10,700,065 | B2 * | 6/2020 | Alptekin | H10D 84/83 |
| 11,063,138 | B2 * | 7/2021 | Singh | H10D 84/83 |
| 11,205,474 | B1 * | 12/2021 | Yang | H10D 89/10 |
| 11,721,748 | B2 * | 8/2023 | Singh | H10D 48/383 |
| | | | | 257/24 |
| 11,832,432 | B2 * | 11/2023 | Hsiao | H10B 12/053 |
| 11,990,516 | B1 * | 5/2024 | George | H10D 84/83 |
| 2003/0030074 | A1 * | 2/2003 | Walker | H10B 41/30 |
| | | | | 257/E27.102 |
| 2007/0141797 | A1 * | 6/2007 | Li | H10D 84/0181 |
| | | | | 257/E21.639 |
| 2007/0297232 | A1 * | 12/2007 | Iwata | H10B 43/20 |
| | | | | 257/E27.111 |
| 2008/0009115 | A1 * | 1/2008 | Willer | H10B 69/00 |
| | | | | 438/257 |
| 2008/0132070 | A1 * | 6/2008 | Li | H10D 64/411 |
| | | | | 438/682 |
| 2008/0233694 | A1 | 9/2008 | Li | |
| 2008/0296664 | A1 * | 12/2008 | Ramkumar | H10D 84/038 |
| | | | | 257/326 |
| 2010/0038724 | A1 * | 2/2010 | Anderson | H10D 84/038 |
| | | | | 438/275 |
| 2010/0059833 | A1 | 3/2010 | Yu et al. | |
| 2010/0323487 | A1 * | 12/2010 | Gaul | H10D 84/83 |
| | | | | 438/295 |
| 2011/0201164 | A1 | 8/2011 | Chung et al. | |
| 2012/0018810 | A1 | 1/2012 | Chambers et al. | |
| 2012/0112250 | A1 * | 5/2012 | Chung | H10D 30/021 |
| | | | | 257/E21.409 |
| 2012/0261645 | A1 * | 10/2012 | Cho | B82Y 30/00 |
| | | | | 977/734 |
| 2012/0292715 | A1 | 11/2012 | Hong et al. | |
| 2013/0099307 | A1 | 4/2013 | Tseng et al. | |
| 2013/0154019 | A1 | 6/2013 | Ando et al. | |
| 2015/0041905 | A1 | 2/2015 | Xie et al. | |
| 2015/0091054 | A1 * | 4/2015 | Su | H10D 84/811 |
| | | | | 257/140 |
| 2015/0287725 | A1 * | 10/2015 | Zang | H10D 84/038 |
| | | | | 438/275 |
| 2015/0325672 | A1 * | 11/2015 | Chen | H10D 64/661 |
| | | | | 438/157 |
| 2016/0211371 | A1 * | 7/2016 | Tsai | H10D 30/796 |
| 2016/0247906 | A1 * | 8/2016 | Wenxu | H10D 64/62 |
| 2016/0315080 | A1 * | 10/2016 | Song | H01L 21/28176 |
| 2016/0365422 | A1 * | 12/2016 | Chen | H01L 21/28105 |
| 2017/0373090 | A1 * | 12/2017 | Correale, Jr. | H10D 84/907 |
| 2018/0068626 | A1 * | 3/2018 | Zhao | H10D 86/441 |
| 2019/0157165 | A1 * | 5/2019 | Kim | H10D 64/017 |
| 2019/0198529 | A1 | 6/2019 | Yadoguchi et al. | |
| 2019/0355749 | A1 * | 11/2019 | Do | G06F 30/39 |
| 2019/0393240 | A1 | 12/2019 | Kim et al. | |
| 2019/0393332 | A1 * | 12/2019 | Then | H10D 84/038 |
| 2020/0006341 | A1 * | 1/2020 | Hong | H10D 64/667 |
| 2020/0044094 | A1 * | 2/2020 | Liu | H01L 21/223 |
| 2020/0118999 | A1 * | 4/2020 | Alptekin | H10D 84/84 |
| 2020/0161455 | A1 * | 5/2020 | Singh | B82Y 10/00 |
| 2021/0210022 | A1 * | 7/2021 | Chang | G09G 3/3266 |
| 2022/0392999 | A1 * | 12/2022 | Iwahori | G11C 11/412 |
| 2023/0122757 | A1 * | 4/2023 | Wang | H01L 23/5226 |
| 2023/0178537 | A1 * | 6/2023 | Dia | H10D 89/10 |
| 2023/0178557 | A1 * | 6/2023 | Hsieh | H10D 84/038 |
| 2023/0197771 | A1 * | 6/2023 | Hsiao | H10D 64/693 |
| | | | | 257/296 |
| 2023/0200044 | A1 * | 6/2023 | Hsiao | H10B 12/488 |
| | | | | 438/589 |
| 2023/0371257 | A1 * | 11/2023 | Lu | B82Y 10/00 |
| 2023/0411395 | A1 * | 12/2023 | Chiu | H10B 20/363 |
| 2024/0014256 | A1 * | 1/2024 | Lin | H10D 84/0142 |
| 2024/0014314 | A1 * | 1/2024 | Tsai | H10B 12/053 |
| 2024/0015951 | A1 * | 1/2024 | Tsai | H10B 12/315 |
| 2024/0038755 | A1 * | 2/2024 | Hu | H10D 84/853 |
| 2024/0090278 | A1 * | 3/2024 | Choi | H10D 86/423 |
| 2024/0206156 | A1 * | 6/2024 | Huang | H10B 12/053 |
| 2024/0282864 | A1 * | 8/2024 | Lee | H10D 30/6735 |
| 2024/0347525 | A1 * | 10/2024 | Onda | H01L 23/5286 |

OTHER PUBLICATIONS

Office Action and and the search report mailed on Dec. 23, 2024 related to U.S. Appl. No. 17/845,776.

Office Action and and the search report mailed on Mar. 11, 2025 related to U.S. Appl. No. 17/845,776.

* cited by examiner

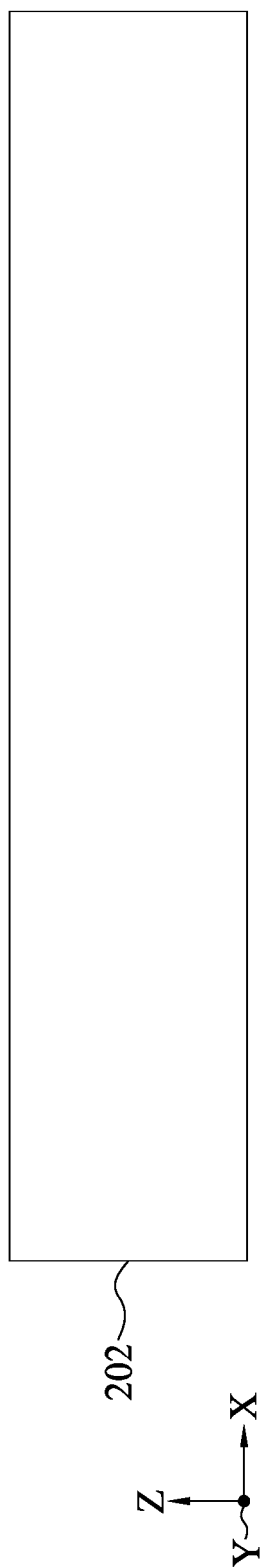

SEMICONDUCTOR DEVICE HAVING GATE ELECTRODES WITH DOPANT OF DIFFERENT CONDUCTIVE TYPES

TECHNICAL FIELD

The present disclosure relates to a semiconductor device, and in particularly to a semiconductor device including gate electrodes doped with dopants of different conductive types.

DISCUSSION OF THE BACKGROUND

With the rapid growth of the electronics industry, the development of integrated circuits (ICs) has achieved high performance and miniaturization. Technological advances in IC materials and design have produced generations of ICs where each generation has smaller and more complex circuits than the previous generation.

DRAM (Dynamic Random Access Memory) stores each bit of data in a separate capacitor within an integrated circuit. Typically, a DRAM is arranged in a square array of one capacitor and transistor per cell. A vertical transistor has been developed for the $4F^2$ DRAM cell, with F denoting the photolithographic minimum feature width or critical dimension (CD). RAM can be applied in a wide variety of devices, such as a one-time-programmable (OTP) device.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a first gate electrode, and a second gate electrode. The first gate electrode is disposed on the substrate. The first gate electrode is doped with a first dopant of a first conductive type. The second gate electrode is disposed on the substrate. The second gate electrode is doped with a second dopant of a second conductive type different from the first conductive type.

Another aspect of the present disclosure provides another semiconductor device. The semiconductor device includes a substrate, a plurality of first gate electrodes and a plurality of second gate electrodes. The plurality of first gate electrodes and the plurality of second gate electrodes are arranged in an array, at least one of which is disposed on the substrate. The first gate electrodes are doped with first dopants having a first conductive type. The second gate electrodes are doped with second dopants having a second conductive type different from the first conductive type.

Another aspect of the present disclosure provides a method for manufacturing a semiconductor device. The method includes: providing a substrate; forming a plurality of gate electrodes on the substrate; doping a first portion of the plurality of gate electrodes with a first dopant having a first conductive type; and doping a second portion of the plurality of gate electrodes with a second dopant having a second conductive type different from the first conductive type.

The embodiments of the present disclosure provide a semiconductor device with gate electrodes with dopants of different conductive types, thereby modifying the threshold voltage of a transistor. Thus, when transistors including gate electrodes, with dopants of different conductive types, are turned on, different currents can be measured, determining a lower logic value "0" and a higher logic value "1." As a result, the semiconductor device of the present disclosure can be configured to generate a code for identification.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 6B, FIG. 7B, FIG. 8B, FIG. 9B, FIG. 10B, FIG. 11B, FIG. 12B and FIG. 13B are cross-sectional views along line B-B' of FIG. 6A, FIG. 7A, FIG. 8A, FIG. 9A, FIG. 10A, FIG. 11A, FIG. 12A and FIG. 13A respectively.

DETAILED DESCRIPTION

Figure 1A:
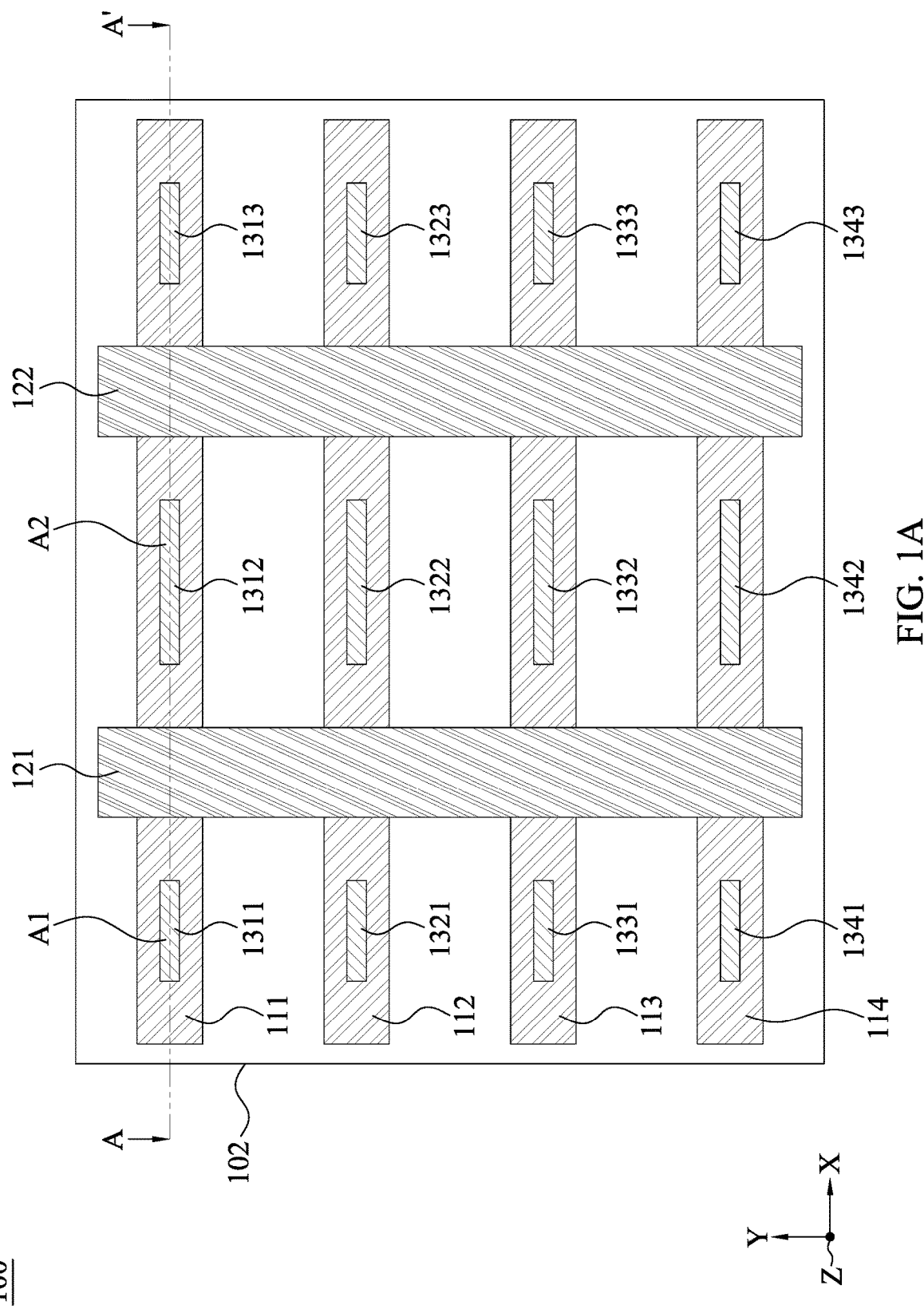
FIG. 1A is a top view of a layout of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1A is a top view of a layout of a semiconductor device 100, in accordance with some embodiments of the present disclosure.

In some embodiments, the semiconductor device 100 may be applicable to semiconductor devices, which can include active components and/or passive components. The active component may include a memory device (e.g., dynamic random access memory (DRAM) device, a one-time programming (OTP) memory device, a static random access memory (SRAM) device, etc.)), a power management device (e.g., power management integrated circuit (PMIC) device)), a logic device (e.g., system-on-a-chip (SoC), central processing unit (CPU), graphics processing unit (GPU), application processor (AP), microcontroller, etc.)), a radio frequency (RF) device, a sensor device, a micro-electro-mechanical-system (MEMS) device, a signal processing device (e.g., digital signal processing (DSP) device)), a front-end device (e.g., analog front-end (AFE) devices)) or other active components. The passive component may include a capacitor, a resistor, an inductor, a fuse or other passive components.

In some embodiments, the semiconductor device 100 can be applied to a memory, memory device, memory die, memory chip, or other components. The semiconductor device 100 can be a portion of memory, memory device, memory die, or memory chip. For example, the memory can be a DRAM or an OTP memory. In some embodiments, the DRAM can be a double data rate fourth generation (DDR4) DRAM. In some embodiments, the memory can include one or more memory cells (or memory bits, memory blocks).

As shown in FIG. 1A, the semiconductor device 100 can include a substrate 102, active regions 111, 112, 113, and 114, gate structures 121 and 122, as well as doped regions 1311, 1312, 1313, 1321, 1322, 1323, 1331, 1332, 1333, 1341, 1342, and 1343.

At least one of the active regions 111-114 can extend along an X-axis. At least one of the active regions 111-114 can be arranged along a Y-axis and spaced apart. The active regions 111-114 can be located within the substrate 102. Two of adjacent active regions 111-114 can be spaced apart by an isolation structure (not shown). The isolation structure can be, for example, a shallow trench isolation (STI), a local oxidization of silicon (LOCOS) structure, or any other suitable isolation structure.

At least one of the gate structures 121 and 122 can be disposed on the substrate 102. At least one of the gate structures 121 and 122 can extend along the Y-axis. At least one of the gate structures 121 and 122 can be arranged along the X-axis and spaced apart.

At least one of the doped regions 1311-1343 can be disposed in the substrate 102. In some embodiments, the area A2 of at least one of the doped regions 1312, 1322, 1332, and 1342 can exceed the area A1 of at least one of the doped regions 1311, 1321, 1331, 1341, 1313, 1323, 1333, and 1343. In some embodiments, the doped regions 1311, 1312, and 1313 as well as gate structures 121 and 122 can define two transistors. For example, the doped regions 1311, 1312, and the gate structure 121 can be included in a first transistor, and the doped regions 1312, 1313, and the gate structure 122 can be included in a second transistor. The doped region 1312 can be a shared source or a shared drain of the aforesaid two transistors.

Figure 1B:
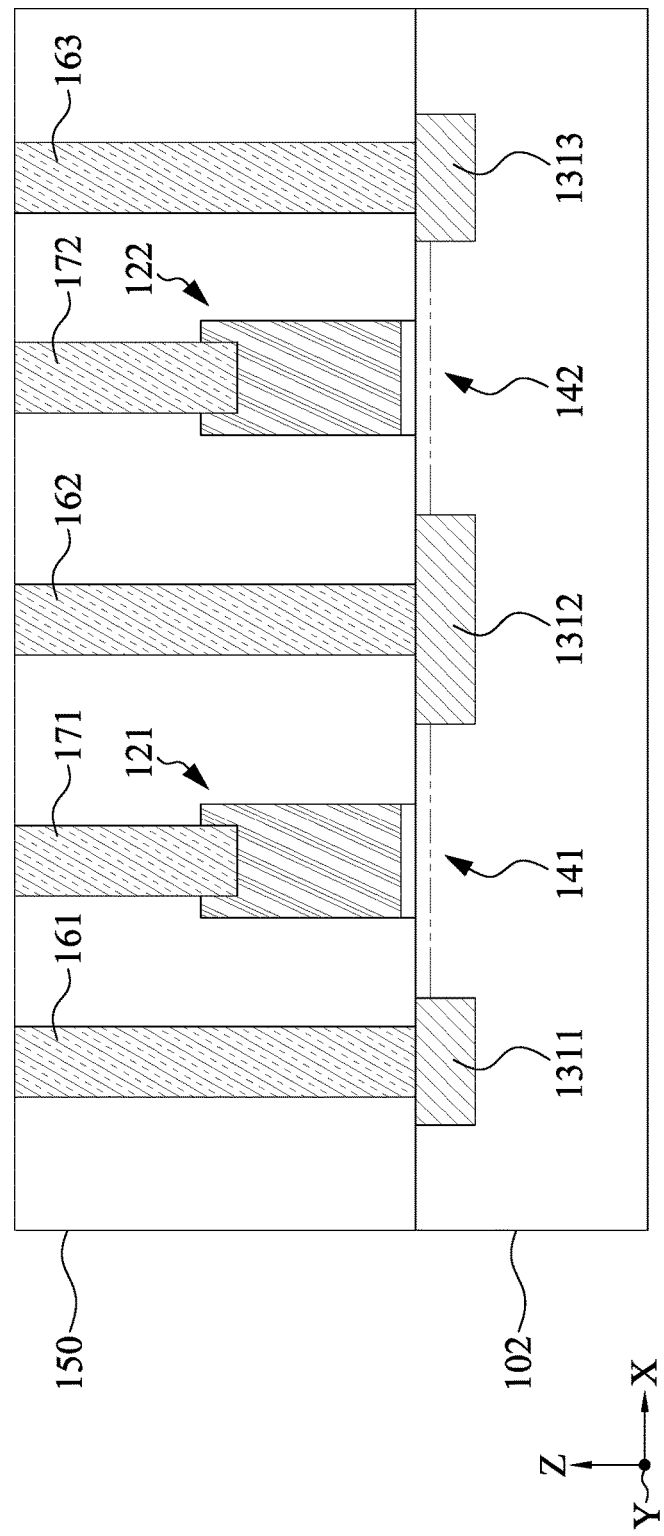
FIG. 1B is a cross-sectional view along line A-A' of the semiconductor device as shown in FIG. 1A, in accordance with some embodiments of the present disclosure.

FIG. 1B is a cross-sectional view along line A-A' of the semiconductor device 100 as shown in FIG. 1A, in accordance with some embodiments of the present disclosure.

As shown in FIG. 1B, the gate structures 121 and 122 can be disposed on the substrate 102. The doped regions 1311, 1312, and 1313 can be disposed or formed within the substrate 102. In some embodiments, the doped regions 1311, 1312, and the gate structure 121 can define a transistor 110-1. In some embodiments, the doped regions 1312, 1313, and the gate structure 122 can define a transistor 110-2. The transistor 110-1 can include a channel region 141 between the doped regions 1311 and 1312. The transistor 110-2 can include a channel region 142 between the doped regions 1312 and 1313. In some embodiments, the doped region 1312 can be a shared source or a shared drain of the transistors 110-1 and the 110-2.

The semiconductor device 100 can include spacers (not shown). The spacer can be disposed on the lateral surface of the gate structures 121 and 122. The spacer can include a single layer structure or a multilayer structure. The spacer can include dielectric material such as silicon oxide, silicon nitride, silicon oxynitride, other dielectric materials, or a combination thereof.

In some embodiments, at least one of the transistors 110-1 and 110-2 can be an N-metal-oxide-semiconductor (NMOS) or a P-metal-oxide-semiconductor (PMOS). In some embodiments, at least one of the doped regions 1311, 1312, and 1313 can include p type dopants, such as boron (B), other group III elements, or any combination thereof. In some embodiments, at least one of the doped regions 1311, 1312, and 1313 can include n type dopants, such as arsenic (As), phosphorus (P), other group V elements, or any combination thereof.

The semiconductor device 100 can further include a dielectric layer 150. The dielectric layer 150 can include silicon oxide ($SiO_x$), silicon nitride ($Si_xN_y$), silicon oxynitride (SiON), phosphosilicate glass (PSG), borophosphosilicate glass (BPSG), a low-k dielectric material (k<4), or other suitable materials.

The semiconductor device 100 can further include conductive contacts 161, 162, 163, 171, and 172. The conductive contact 161 can be electrically connect to the doped region 1311. The conductive contact 162 can be electrically connect to the doped region 1312. The conductive contact 163 can be electrically connect to the doped region 1313. The conductive contact 171 can be electrically connect to the gate structure 121. The conductive contact 172 can be electrically connect to the gate structure 122. The conductive contacts can include conductive materials, such as tungsten (W), copper (Cu), aluminum (Al), tantalum (Ta), molybdenum (Mo), tantalum nitride (TaN), titanium, titanium nitride (TiN), or the like, and/or a combination thereof.

In some embodiments, the gate structures 121 and 122 can be doped with dopants of different conductive types. For example, the gate electrode of the gate structure 121 can be doped with dopants of p type, and the gate electrode of the gate structure 122 can be doped with dopants of n type.

Figure 2A:
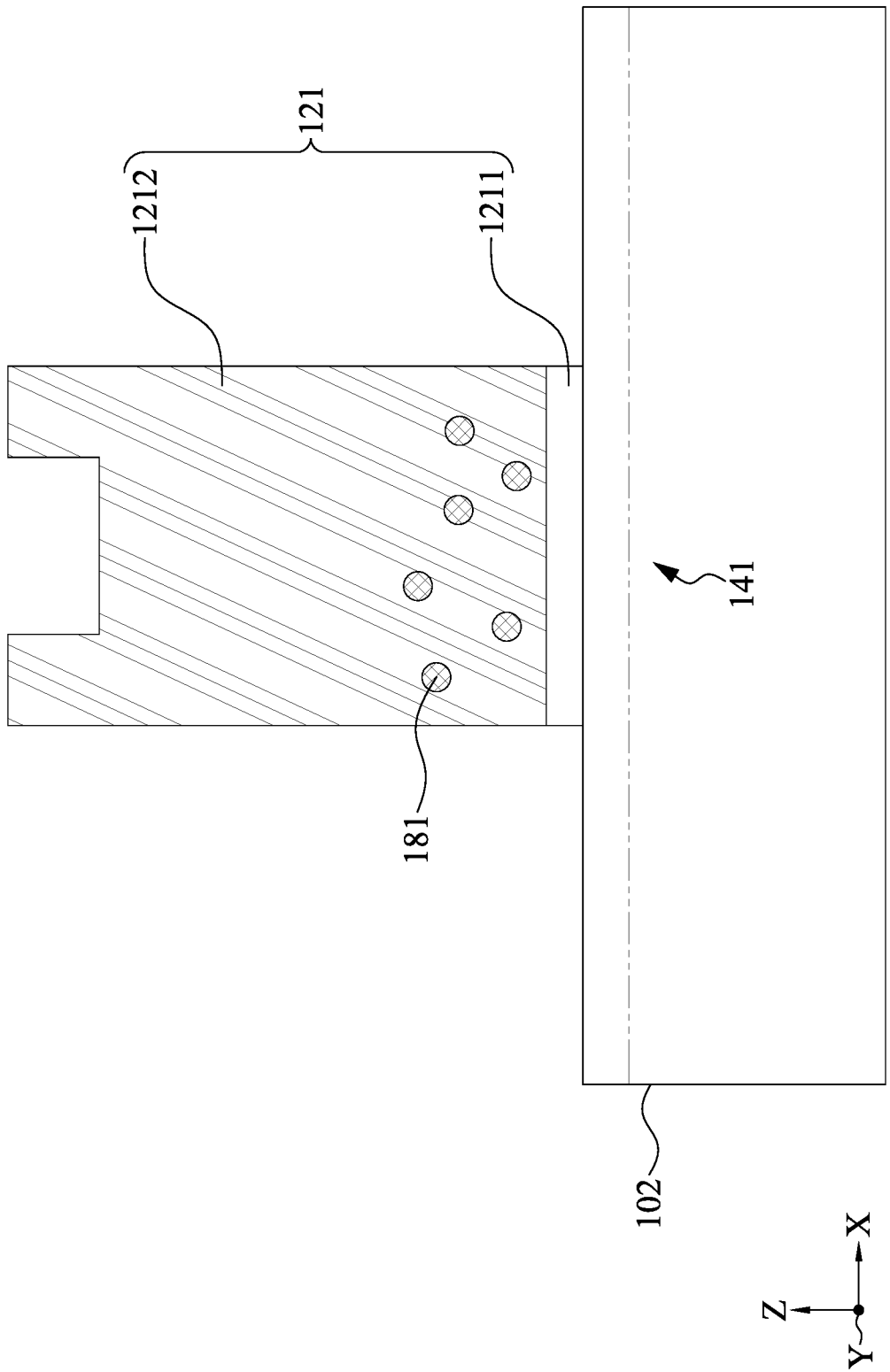
FIG. 2A is a cross-sectional view of a gate structure of a semiconductor device, in accordance with some embodiments of the present disclosure.
Figure 2B:
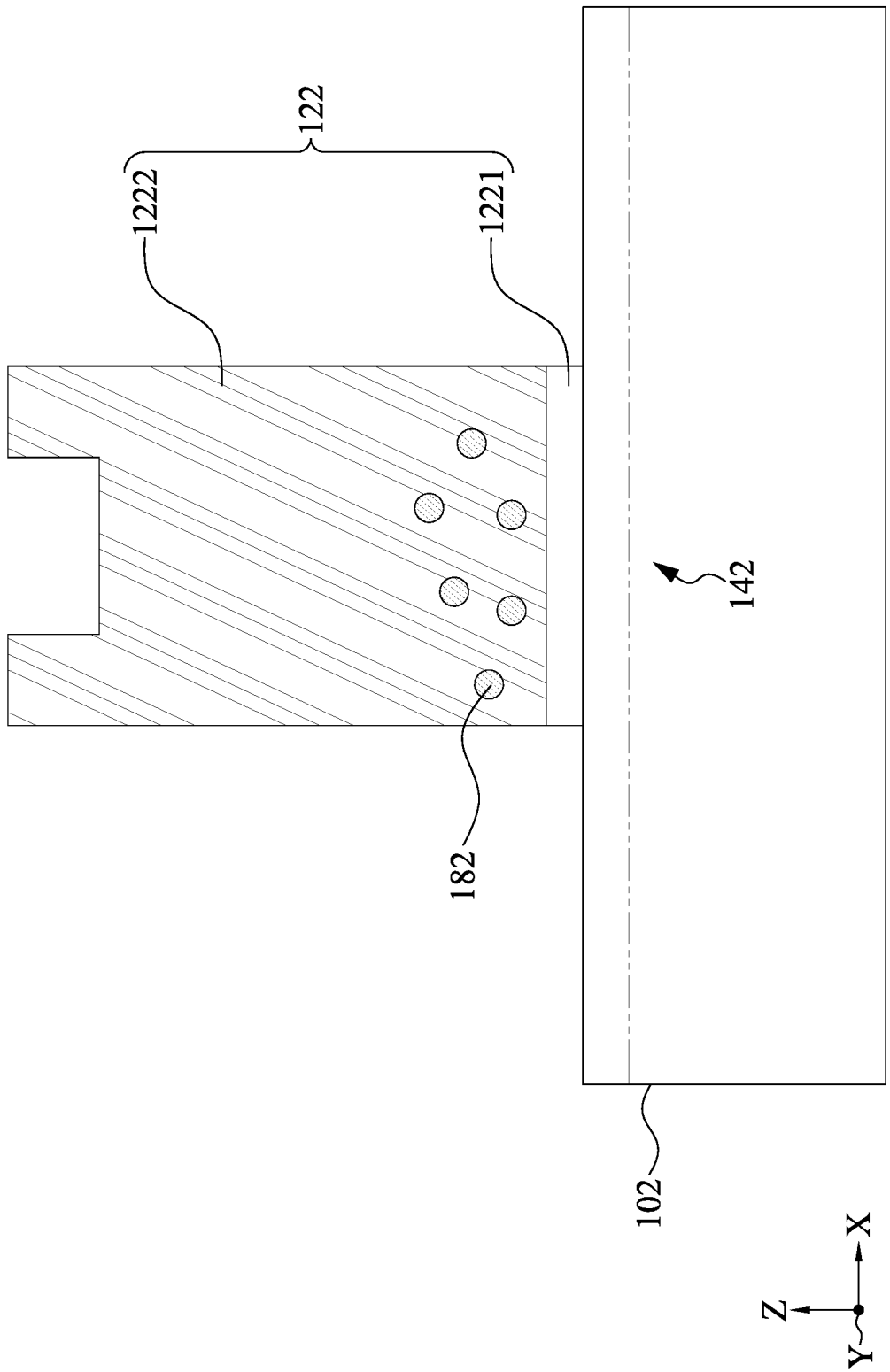
FIG. 2B is a cross-sectional view of a gate structure of a semiconductor device, in accordance with some embodiments of the present disclosure.

FIG. 2A and FIG. 2B are cross-sectional views of gate structures 121 and 122 of the semiconductor device 100, in accordance with some embodiments of the present disclosure.

As shown in FIG. 2A and FIG. 2B, the gate structure 121 can include a gate dielectric 1211 and a gate electrode 1212 over the gate dielectric 1211. The gate structure 122 can include a gate dielectric 1221 and a gate electrode 1222 over the gate dielectric 1221.

At least one of the gate dielectrics 1211 and 1221 can have a single layer or a multilayered structure. In some embodiments, at least one of the gate dielectrics 1211 and 1221 can include dielectric material such as silicon oxide, silicon nitride, silicon oxynitride, other dielectric materials, or a combination thereof. In some embodiments, at least one of the gate dielectrics 1211 and 1221 is a multilayered structure that includes an interfacial layer and a high-k (dielectric constant greater than 4) dielectric layer. The interfacial layer can include dielectric material such as silicon oxide, silicon nitride, silicon oxynitride, other dielectric materials, or a combination thereof. The high-k dielectric layer can include high-k dielectric material such as $HfO_2$, HfSiO, HfSiON, HfTaO, HfTiO, HfZrO, other suitable high-k dielectric materials, or a combination thereof. In some embodiments, the high-k dielectric material can further be selected from metal oxides, metal nitrides, metal silicates, transition metal-oxides, transition metal-nitrides, transition-metal silicates, metal oxynitrides, metal aluminates, and combinations thereof.

In some embodiments, at least one of the gate electrodes 1212 and 1222 can include a charge trapping material. As used herein, the charge may refer to electron and hole charges. As used herein, the charge trapping material can refer to a material that can restrict the movement of electrons (or holes). In some embodiments, at least one of the gate electrodes 1212 and 1222 can include a semiconductor material or other suitable materials. In some embodiments, at least one of the gate electrodes 1212 and 1222 can include polysilicon or other suitable semiconductor materials.

As shown in FIG. 2A, dopants 181 can be doped in the gate structure 121. In some embodiments, the dopants 181 can be doped in the gate electrode 1212 of the gate structure 121. In some embodiments, the channel region 141 is free from being doped with the dopants 181 or free of dopants. In some embodiments, the channel region 141 is free of dopants 182. In some embodiments, at least one of the gate dielectrics 1211 and 1221 is free of dopants 181. As shown in FIG. 2B, dopants 182 can be doped in the gate structure 122. In some embodiments, the dopants 182 can be doped in the gate electrode 1222 of the gate structure 122. In some embodiments, the channel region 142 is free of dopants 182. In some embodiments, the channel region 142 is free of dopants 181. In some embodiments, at least one of the gate dielectrics 1211 and 1221 is free of dopants 182. In some embodiments, the dopant 181 can be of a first conductive type, such as a p type. In some embodiments, the dopant 182 can be of a second conductive type different from the first conductive type, such as an n type.

In some embodiments, the dopants 181 and 182 can be utilized to modify the threshold voltage of the transistors 110-1 and 110-2. The transistor 110-1 has a first threshold voltage. The transistor 110-2 has a second threshold voltage. In some embodiments, the first threshold voltage of the transistor 110-1 can be different from the second threshold voltage of the transistor 110-2. In some embodiments, the first threshold voltage of the transistor 110-1 can be lower than the second threshold voltage of the transistor 110-2.

Referring back to FIG. 1B, in some embodiments, the doped region 1311 can receive a higher voltage, such as 1.2 V, the doped region 1312 can be electrically connected to ground, and the doped region 1313 can be electrically floating. In this condition, a first current can be generated when the transistor 110-1 is turned on.

In some embodiments, the doped region 1311 can be electrically floating, the doped region 1312 can be electrically connected to ground, and the doped region 1313 can receive a higher voltage, such as 1.2 V. In this condition, a second current can be generated when the transistor 110-2 is turned on.

Since the threshold voltages of the transistors 110-1 and 110-2 are different, the first current is different from the second current. In some embodiments, logic values, such as "1" and "0," can be determined based on the current when the transistor is turned on. That is, when the transistor 110-1 or 110-2 is turned on, a high logic value "1" or a low logic value "0" can be determined. For example, when the transistor 110-1 is turned on, a high logic value "1" is determined, and when the transistor 110-2 is turned on, a low logic value "0" is determined.

Further, the semiconductor device 100 can include a capacitor (not shown), which can be utilized to store the logic value "1" or "0." For example, during a read operation, a word line, which is electrically coupled to or connected to the gate structure 121 or 122, can be asserted, turning on the transistor 110-1 or 110-2. The enabled transistor 110-1 or 110-2 allows the voltage across the capacitor to be read by a sense amplifier through a bit line. During a write operation, the data to be written can be provided on the bit line when the word line is asserted.

In a comparative semiconductor device, the threshold voltage of the transistor is modified by burning the gate dielectric. In the embodiments of this disclosure, the threshold voltage can be modified by doping the gate electrode with dopants of different conductive types. The arrangement (or distribution) of the gate structures with n type dopants or p type dopants can be predetermined by a customized reticle, which can determine an arrangement (or distribution) of the logic value "1" or "0." As a result, the semiconductor device 100 can be configured to generate a code for identification.

Figure 3:
FIG. 3 is a top view of a semiconductor device, in accordance with some embodiments of the present disclosure.

FIG. 3 is a top view of a semiconductor device 200, in accordance with some embodiments of the present disclosure. It should be noted that some elements are omitted from FIG. 3 for brevity, and the semiconductor device 200 can further include other elements.

As shown in FIG. 3, the semiconductor device 200 can include an array 220 of gate electrodes 2111, 2112, 2113, 2114, 2115, 2121, 2122, 2123, 2124, 2125, 2131, 2132, 2133, 2134, 2135, 2141, 2142, 2143, 2144, and 2145. At least one of the gate electrodes 2111-2145 can be included in a transistor.

The array 220 can include rows 221, 222, 223, and 224. At least one of the rows 221-224 can include five gate electrodes. The number of rows and gate electrodes in one row are only exemplary, and the present disclosure is not intended to be limited thereto. The patterns (or dots) of the gate electrodes 2111-2145 can be utilized to identify which type of dopants are doped into the gate electrodes 2111-2145. For example, the gate electrodes 2111, 2112, 2113, 2114, 2115, 2121, 2124, 2125, 2131, 2132, 2135, 2143, and 2145 can have dopants of n type doped therein, and can be grouped as "gate electrode 210-1". The gate electrodes 2122, 2123, 2133, 2134, 2141, 2142, and 2144 can have dopants of p type dopants therein, and can be grouped as "gate electrode 210-2".

In some embodiments, rows 221-224 may have different amounts of gate electrodes 210-1 and 210-2. For example, the row 221 can have five gate electrodes 210-1, and the row 222 can have three gate electrodes 210-1. In some embodiments, rows 221-224 can have different amounts of gate electrodes 210-2. For example, the row 223 can have two gate electrodes 210-2, and row 224 can have three gate electrodes 210-2.

As mentioned, when the gate electrode is doped with different type dopants, the threshold voltage of the transistor can be modified. That is, one transistor including the gate electrode 210-1 and another including the gate electrode 210-2 can have different threshold voltages. For example, the transistor including the gate electrode 210-1 can have a higher threshold voltage, and the transistor including the gate electrode 210-2 can have a lower threshold voltage. Thus, when the transistor including the gate electrode 210-1 is turned on, a lower current can be measured, determining a lower logic value "0." When the transistor including the gate electrode 210-2 is turned on, a higher current can be measured, determining a higher logic value "1."

Figure 4:
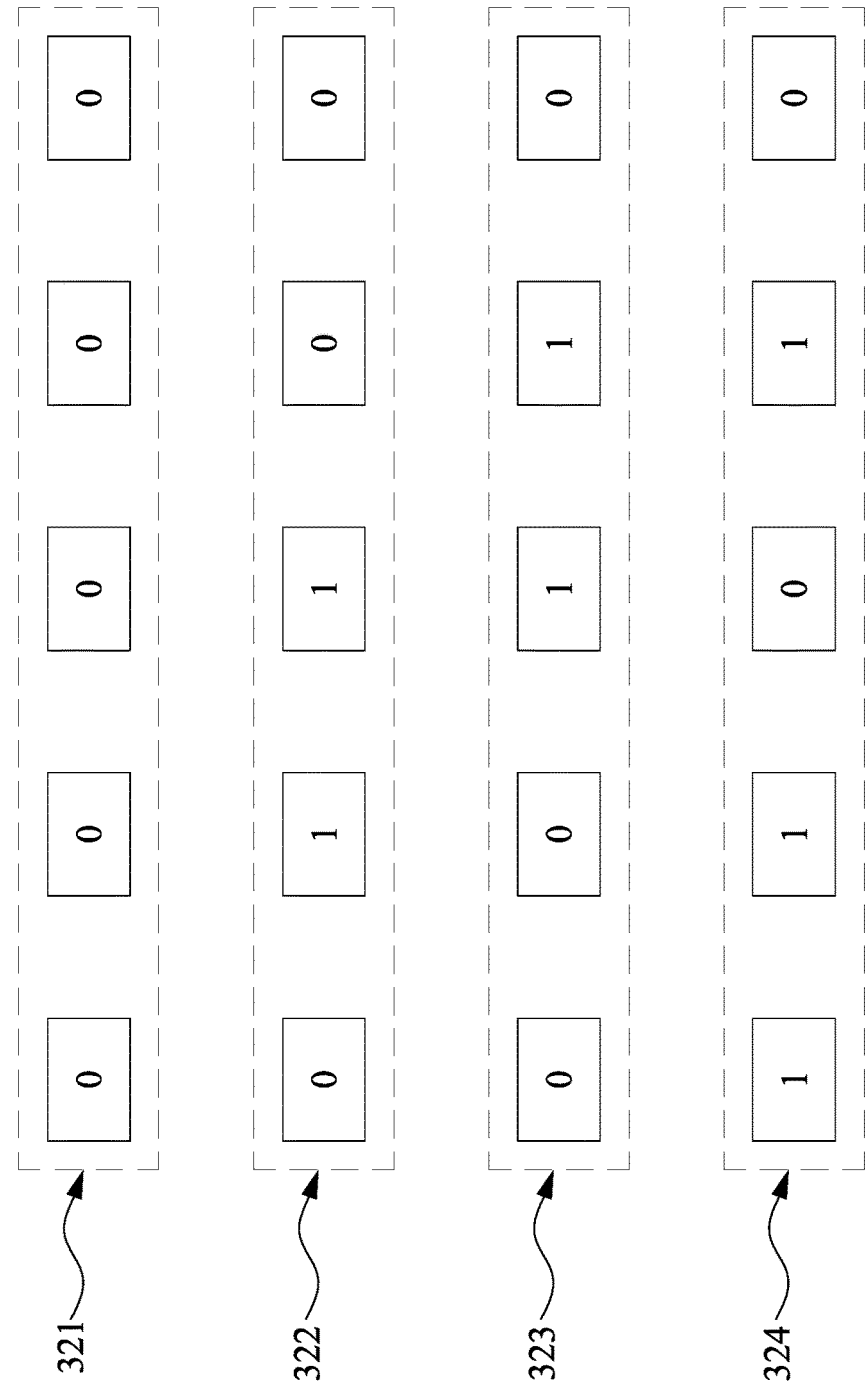
FIG. 4 illustrates a logic information corresponding to the semiconductor device as shown in FIG. 3, in accordance with some embodiments of the present disclosure.

In some embodiments, each row 221-224 can have different arrangements (or distributions) of gate electrodes 210-1 and 210-2. The arrangement of gate electrodes 210-1 and 210-2 can be configured to store information or data. The stored information or data may generate a code, a function, or an identification upon read or execution by a processor. Referring to FIG. 4, a logic information 300 corresponding to the semiconductor device 200 as shown in FIG. 3 can include bit strings 321, 322, 323, and 324. At least one of the bit strings 321-324 can include five logic values composed of logic values "0," "1," and a combination thereof. For example, bit string 321 can be composed of "0," "0," "0," "0," and "0" in sequence, and bit string 322 can be composed of "0," "1," "1," "0," and "0" in sequence.

In some embodiments, a portion of the logic information 300 can be used as a code for identification. For example, a row of the logic information 300 can function as a code for identification. In other embodiments, a portion of the logic information 300 can function as a code for identification. In some embodiments, a 2×2 array of the logic information 300 can function as a code for identification. In a 2×2 array, 4-bit data can be represented by 16 arrangements of logic values "0" and "1," at least one of which corresponds to an arrangement of the gate electrodes 210-1 and 210-2. Referring back to FIG. 3, the gate electrodes 2121, 2122, 2131, and 2132 can define a 2×2 array, and correspond to logic values "0," "1," "0," and "0," respectively. The arrangement of the logic values of an array can function as a code for identification. The aforesaid array can be an M×N array, in which at least one of M and N is a real number or a positive integer.

In other embodiments, the gate electrodes 210-1 and 210-2 can be applied to perform the logic operations, such as a XOR logic operation (or its complementary XNOR), a NAND logic operation (or its complementary AND), or a NOR logic operation (or its complementary OR). For example, when a circuit includes the gate electrodes 210-1 and/or 210-2, it can carry out an identification of the OR function, NAND function, and XNOR function, with these three operations being complementary operations respectively of the aforementioned logic operations.

Figure 5:
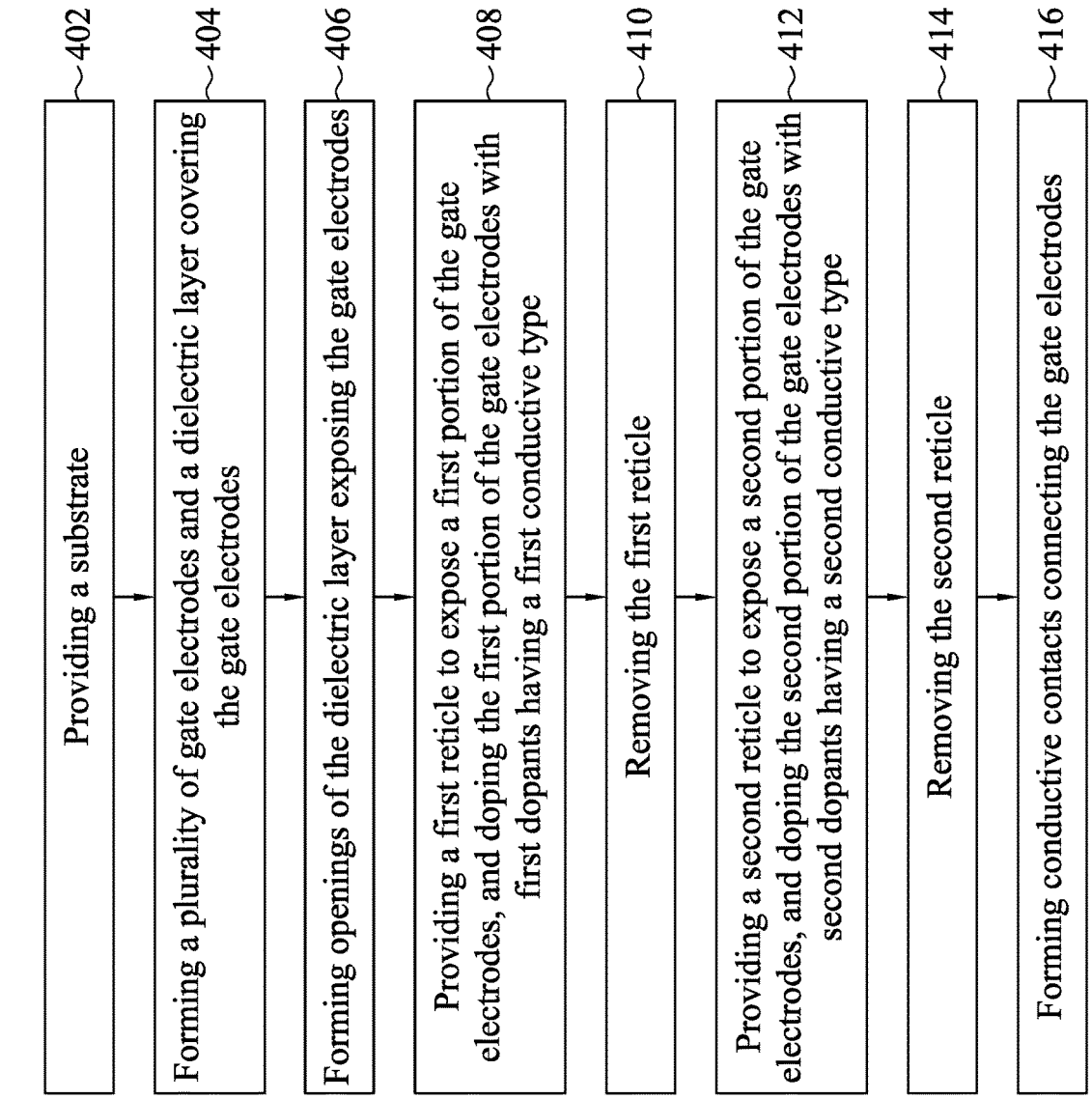
FIG. 5 is a flowchart illustrating a method for manufacturing a semiconductor device, in accordance with various aspects of the present disclosure.

FIG. 5 is a flowchart illustrating a method 400 for manufacturing a semiconductor device, in accordance with various aspects of the present disclosure.

The method 400 begins with operation 402 in which a substrate is provided.

The method 400 continues with operation 404 in which a plurality of gate structures are formed. At least one of the gate structures can include a gate dielectric and a gate electrode formed thereon. The operation 404 can further include forming a plurality of doped regions in the substrate to define a plurality of transistors. Some of the doped regions can be a shared source or a shared drain of two abutting transistors. Operation 404 can further include forming a dielectric layer over the substrate to cover the gate electrodes.

The method 400 continues with operation 406 in which a plurality of openings of the dielectric layer are formed. The openings can expose the doped regions and/or the gate electrodes.

The method 400 continues with operation 408 in which a first reticle is provided. The first reticle exposes a first portion of the gate electrodes, and a second portion of the gate electrodes is covered by the first reticle. The operation 408 can further include doping the first portion of the gate electrodes with dopants of a first conductive type. The operation 408 can further include forming a photosensitive material to cover the dielectric layer. The photosensitive material is exposed though the first reticle, forming first openings defined by the photosensitive material. The dopants having the first conductive type can be doped into the first portion of the gate electrodes through the first openings of the photosensitive material.

The method 400 continues with operation 410 in which the first reticle is removed. Further, the photosensitive material is removed. The first portion of the gate electrodes and the second portion of the gate electrodes are exposed.

The method 400 continues with operation 412 in which a second reticle is provided. The second reticle exposes the second portion of the gate electrodes, and the first portion of the gate electrodes is covered by the second reticle. The operation 412 can further include doping the second portion of the gate electrodes with dopants of a second conductive type different from the first conductive type. The operation 412 can further include forming a photosensitive material to cover the dielectric layer. The photosensitive material is exposed though the second reticle, forming second openings defined by the photosensitive material. The dopants having the second conductive type can be doped into the second portion of the gate electrodes through the second openings.

The method 400 continues with operation 414 in which the second reticle is removed. Further, the photosensitive material is removed. The first portion of the gate electrodes and the second portion of the gate electrodes are exposed.

The method 400 continues with operation 416 in which conductive vias are formed to fill the openings of the dielectric layer, thereby producing the semiconductor device.

The method 400 can be utilized to determine an arrangement (or distribution) of the gate electrodes with dopants of different conductive types, thereby determining an arrangement (or distribution) of logic value "1" or "0." As a result, the method 400 can be configured to generate a code for identification.

The method 400 is merely an example, and is not intended to limit the present disclosure beyond what is explicitly recited in the claims. Additional operations can be provided before, during, or after each operation of the method 400, and some operations described can be replaced, eliminated, or moved around for additional embodiments of the method. In some embodiments, the method 400 can include further operations not depicted in FIG. 5. In some embodiments, the method 400 can include one or more operations depicted in FIG. 5.

FIG. 6A, FIG. 7A, FIG. 8A, FIG. 9A, FIG. 10A, FIG. 11A, FIG. 12A and FIG. 13A illustrate one or more stages of an example of a method for manufacturing a semiconductor device according to some embodiments of the present disclosure, and FIG. 6B, FIG. 7B, FIG. 8B, FIG. 9B, FIG. 10B, FIG. 11B, FIG. 12B and FIG. 13B are cross-sectional views along line B-B' of FIG. 6A, FIG. 7A, FIG. 8A, FIG. 9A, FIG. 10A, FIG. 11A, FIG. 12A and FIG. 13A respectively. It should be noted that some elements are omitted from 6B, FIG. 7B, FIG. 8B, FIG. 9B, FIG. 10B, FIG. 11B, FIG. 12B and FIG. 13B for brevity.

Figure 6A:
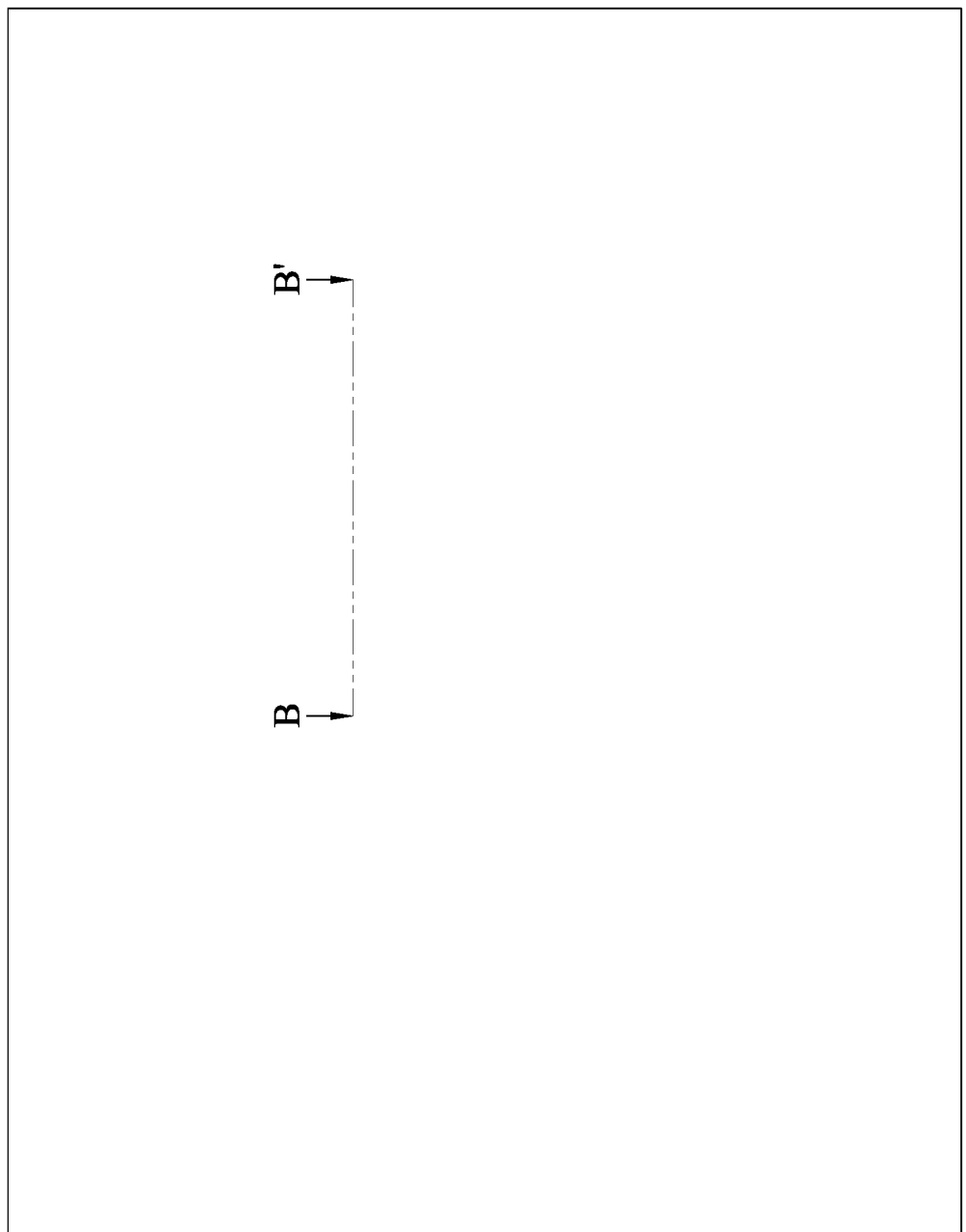
FIG. 6A, FIG. 7A, FIG. 8A, FIG. 9A, FIG. 10A, FIG. 11A, FIG. 12A and FIG. 13A illustrate one or more stages of an example of a method for manufacturing a semiconductor device according to some embodiments of the present disclosure.

Referring to FIG. 6A and FIG. 6B, a substrate 202 is provided. The substrate 202 can have a well region (not shown). A plurality of isolation structures (not shown) can be formed in the substrate. As one example, forming isolation structures can include a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multilayered structure, such as a thermal oxide liner layer and filling layer(s) of silicon nitride or silicon oxide.

Figure 7A:
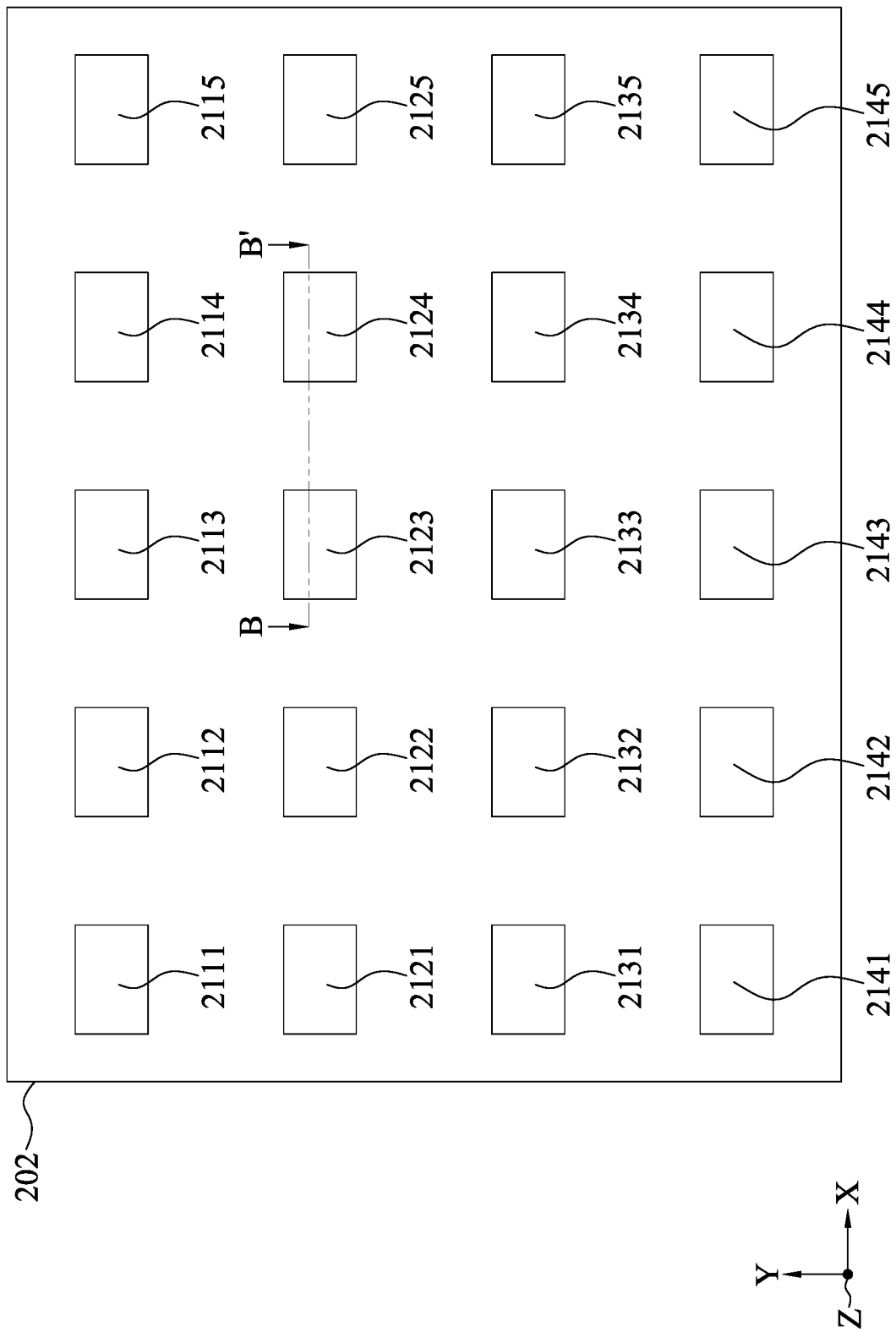
Figure 7B:
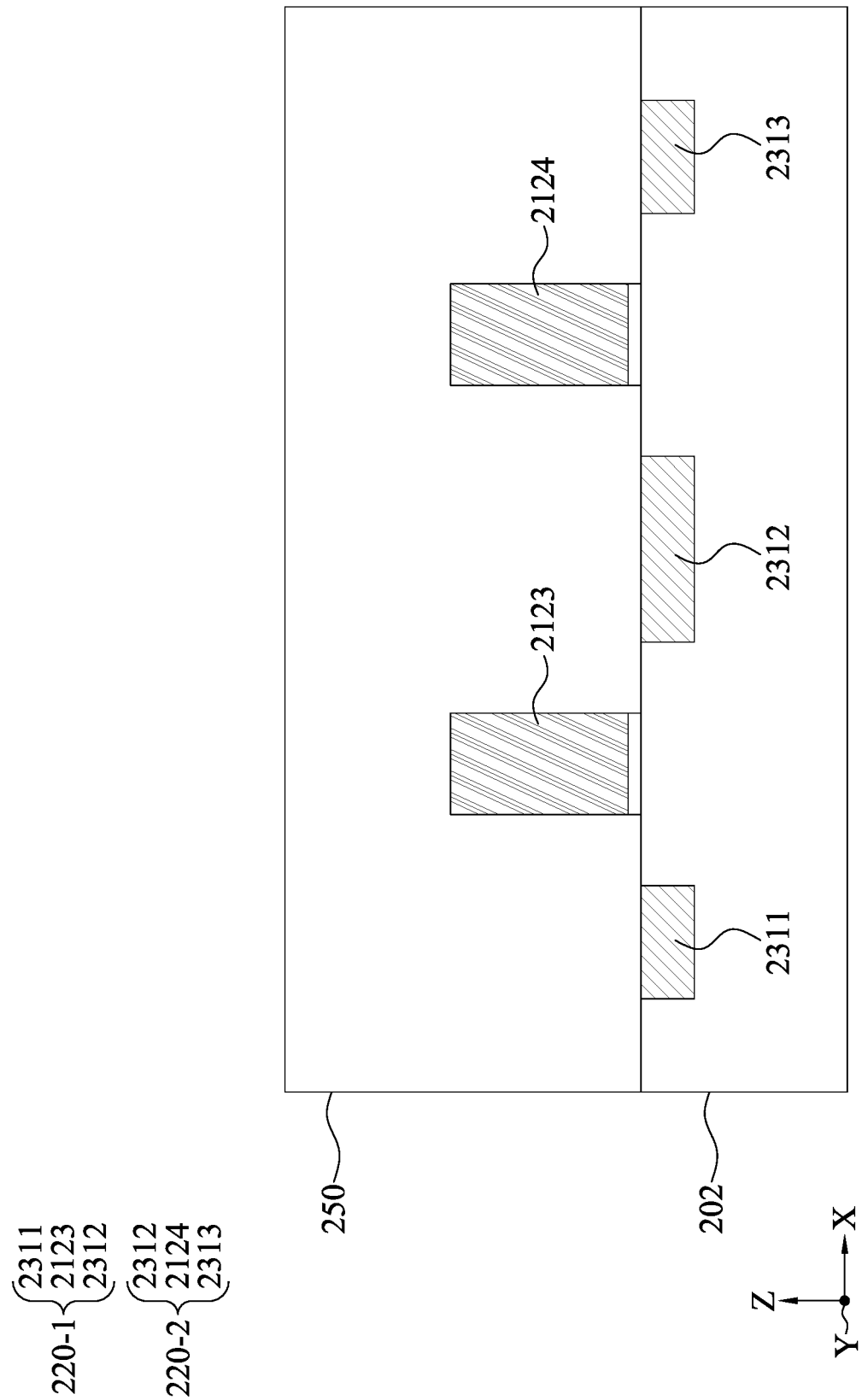

Referring to FIG. 7A and FIG. 7B, a plurality of gate structures are formed. At least one of the gate structures can include one of the gate electrodes 2111-2145. The gate electrodes 2111-2145 can be formed by chemical vapor deposition (CVD), atomic layer deposition (ALD), physical vapor deposition (PVD), low-pressure chemical vapor deposition (LPCVD), or other suitable processes. The doped regions, such as 2311, 2312, and 2313 can be formed in the substrate 202. The area of the doped region 2312 can exceed that of the doped region 2311 or 2313. The doped region 2311, the gate electrode 2123, and the doped region 2312 can be used to define a transistor 220-1. The doped region 2312, the gate electrode 2124, and the doped region 2313 can be used to define a transistor 220-2. In some embodiments, the doped region 2312 can be a shared source or a shared drain of the transistors 220-1 and 220-2. A dielectric layer 250 can be formed over the substrate 202 to cover the gate electrodes 2123 and 2124. The dielectric layer 250 can be formed by CVD, ALD, PVD, LPCVD, or other suitable processes.

Figure 8A:
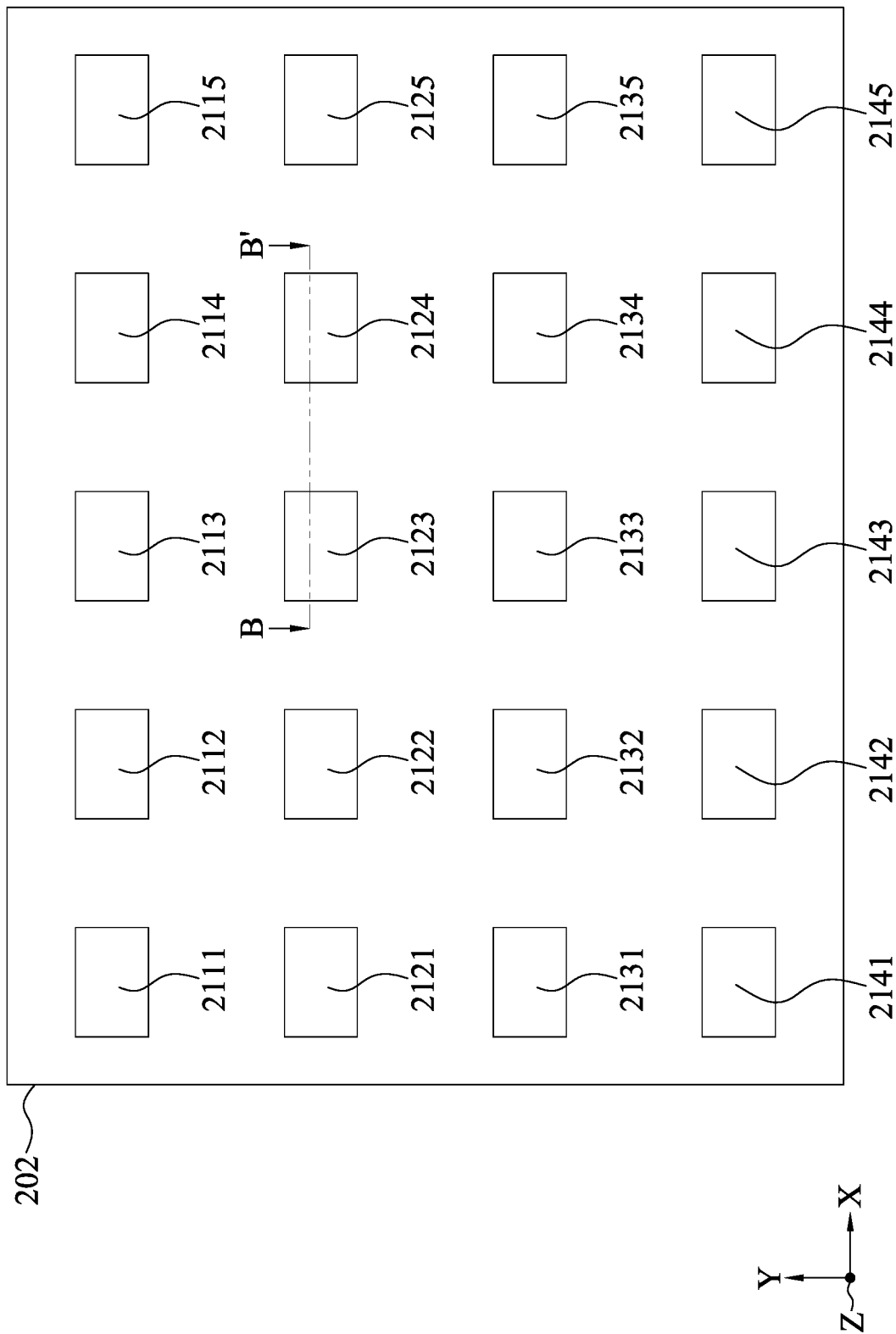
Figure 8B:
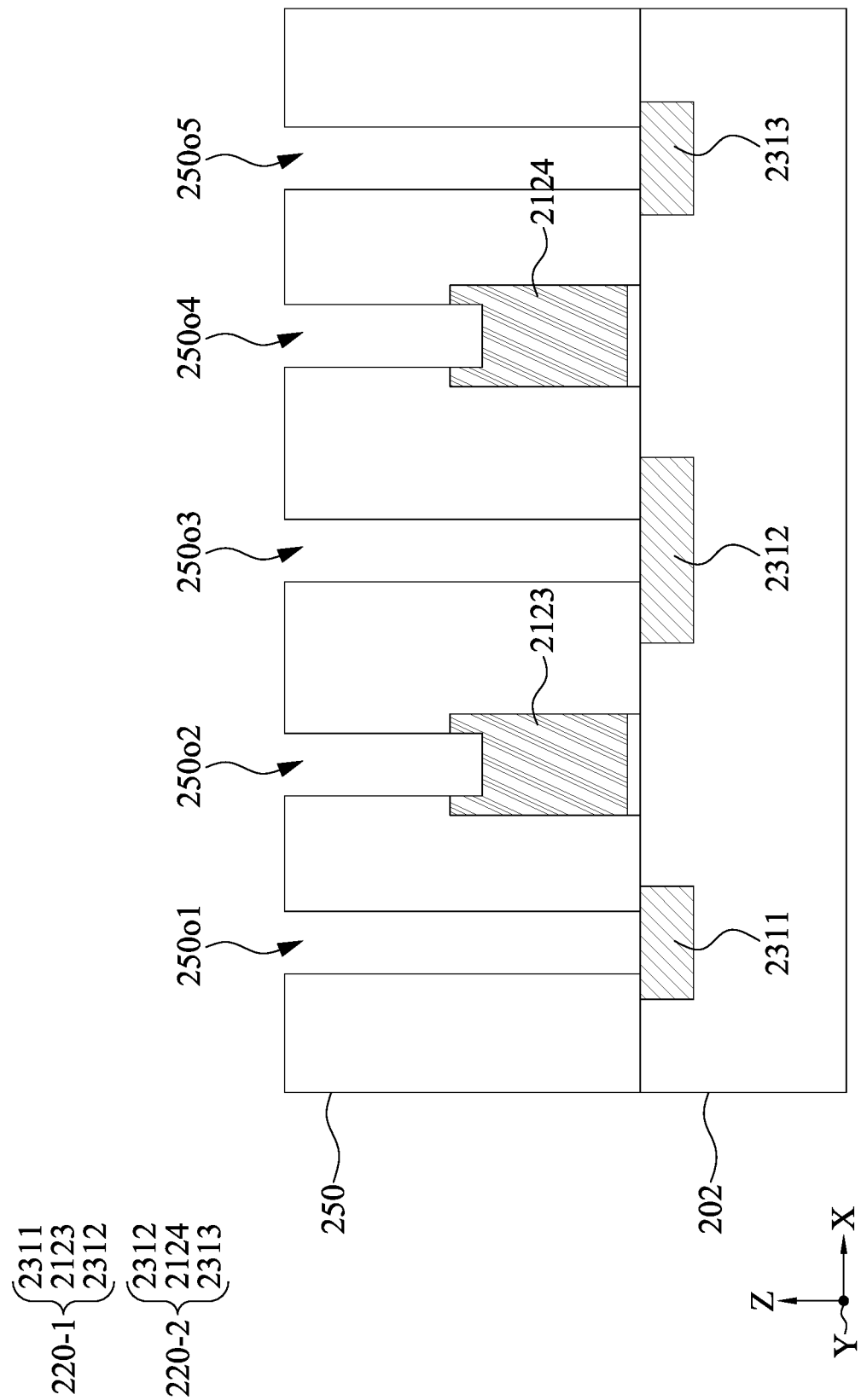

Referring to FIG. 8A and FIG. 8B, openings $250o1$, $250o2$, $250o3$, $250o4$, and $250o5$ are formed. The opening $250o1$ penetrates the dielectric 250 and exposes the doped region 2311. The opening $250o2$ penetrates a portion of the dielectric 250 and exposes the gate electrodes 2123. The opening $250o3$ penetrates the dielectric 250 and exposes the doped region 2312. The opening $250o4$ penetrates a portion of the dielectric 250 and exposes the gate electrodes 2124. The opening $250o5$ penetrates the dielectric 250 and exposes the doped region 2313. The openings $250o1$-$250o5$ can be formed by etching process, such as dry etching or wet etching. In other embodiments, the openings 250-1-250-5 can be formed in different steps, and the present disclosure is not intended to be limiting.

Figure 9A:
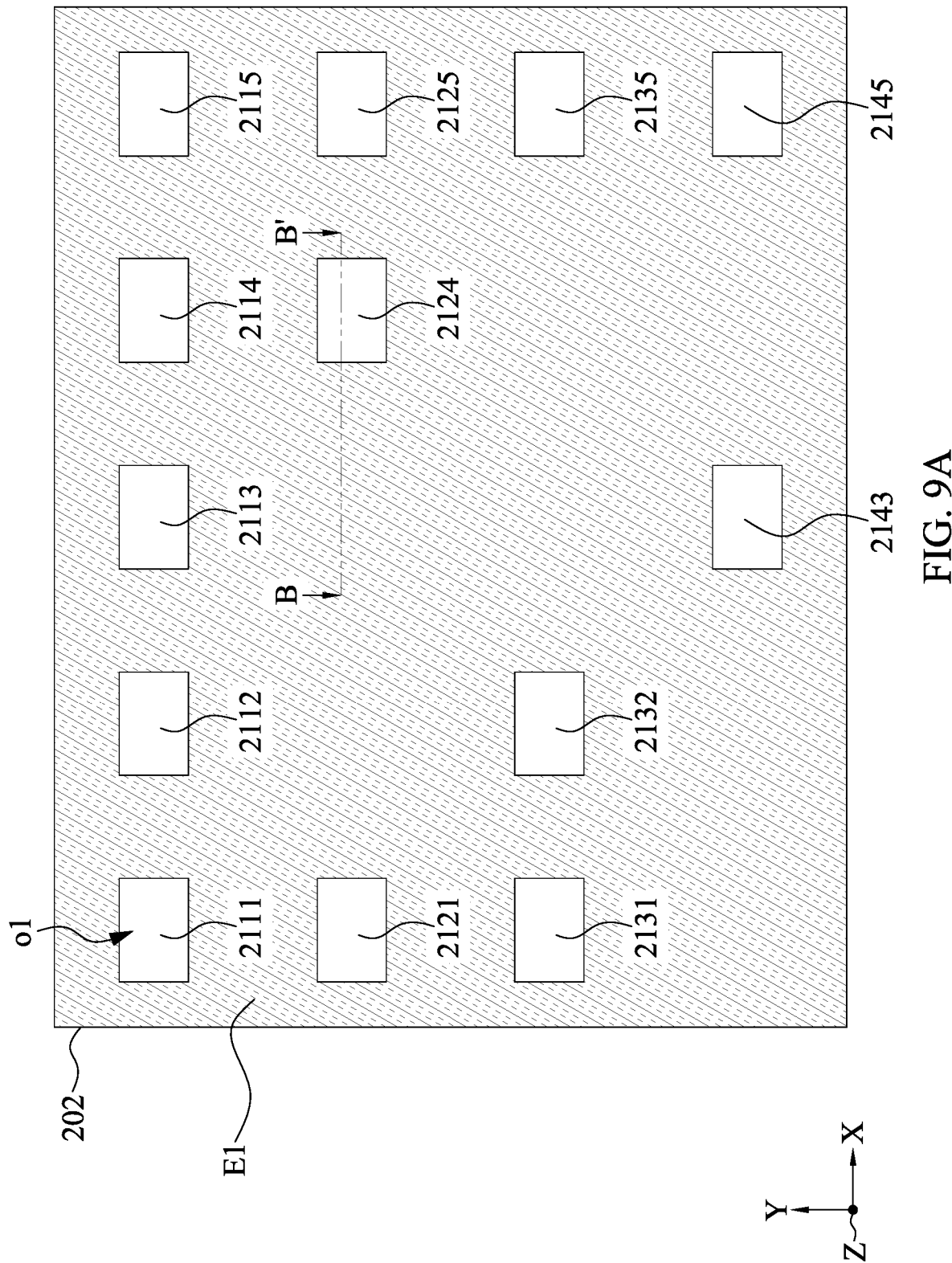
Figure 9B:
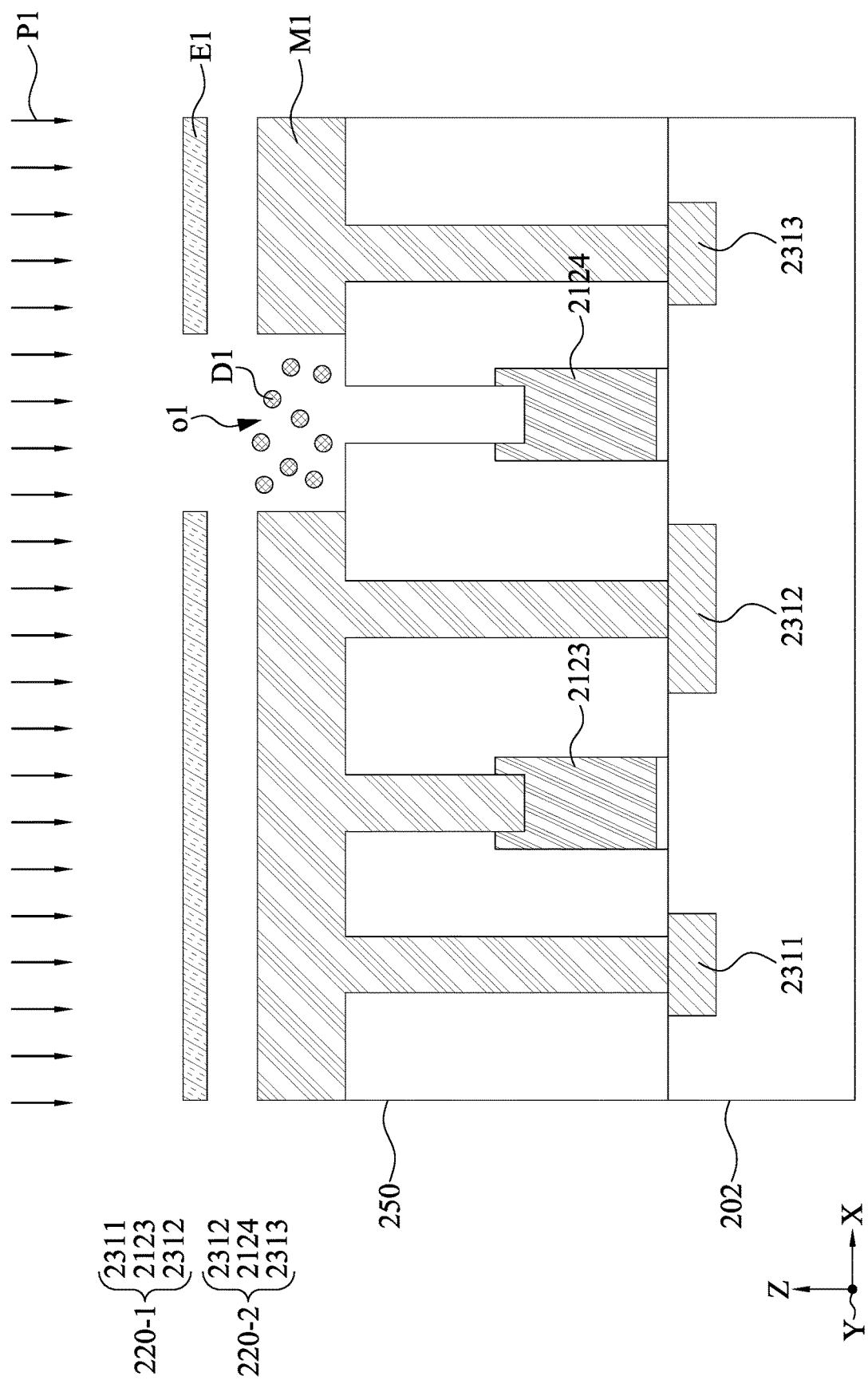

Referring to FIG. 9A and FIG. 9B, a reticle E1 is provided. The reticle E1 exposes a portion of the gate electrodes, such as the gate electrodes 2111, 2112, 2113, 2114, 2115, 2121, 2124, 2125, 2131, 2132, 2135, 2143, and 2145. The other portion of the gate electrodes, such as gate electrodes 2122, 2123, 2133, 2134, 2141, 2142, and 2144 are covered by the reticle E1.

In some embodiments, a photosensitive material M1 can be formed over the dielectric layer 250. The photosensitive material M1 can include a negative-tone photoresist or a positive-tone photoresist. The photosensitive material M1 can be exposed through the reticle E1, forming openings o1 to expose the gate electrodes 2111, 2112, 2113, 2114, 2115, 2121, 2124, 2125, 2131, 2132, 2135, 2143, and 2145. A doping process P1 can be performed to dope the gate electrodes 2111, 2112, 2113, 2114, 2115, 2121, 2124, 2125, 2131, 2132, 2135, 2143, and 2145 with dopants D1. In some embodiments, the dopant D1 can be of a first conductive type, such as n type. The dopants D1 can be doped into the gate electrodes 2111, 2112, 2113, 2114, 2115, 2121, 2124, 2125, 2131, 2132, 2135, 2143, and 2145 through the openings o1. In some embodiments, the openings $250o1$, $250o2$, $250o3$, and $250o5$ can be filled with the photosensitive material M1 or other suitable materials. In other embodiments, the openings $250o1$, $250o3$, and $250o5$ can be formed after the gate electrodes 2111-2145 are doped with dopants of different conductive type.

Figure 10A:
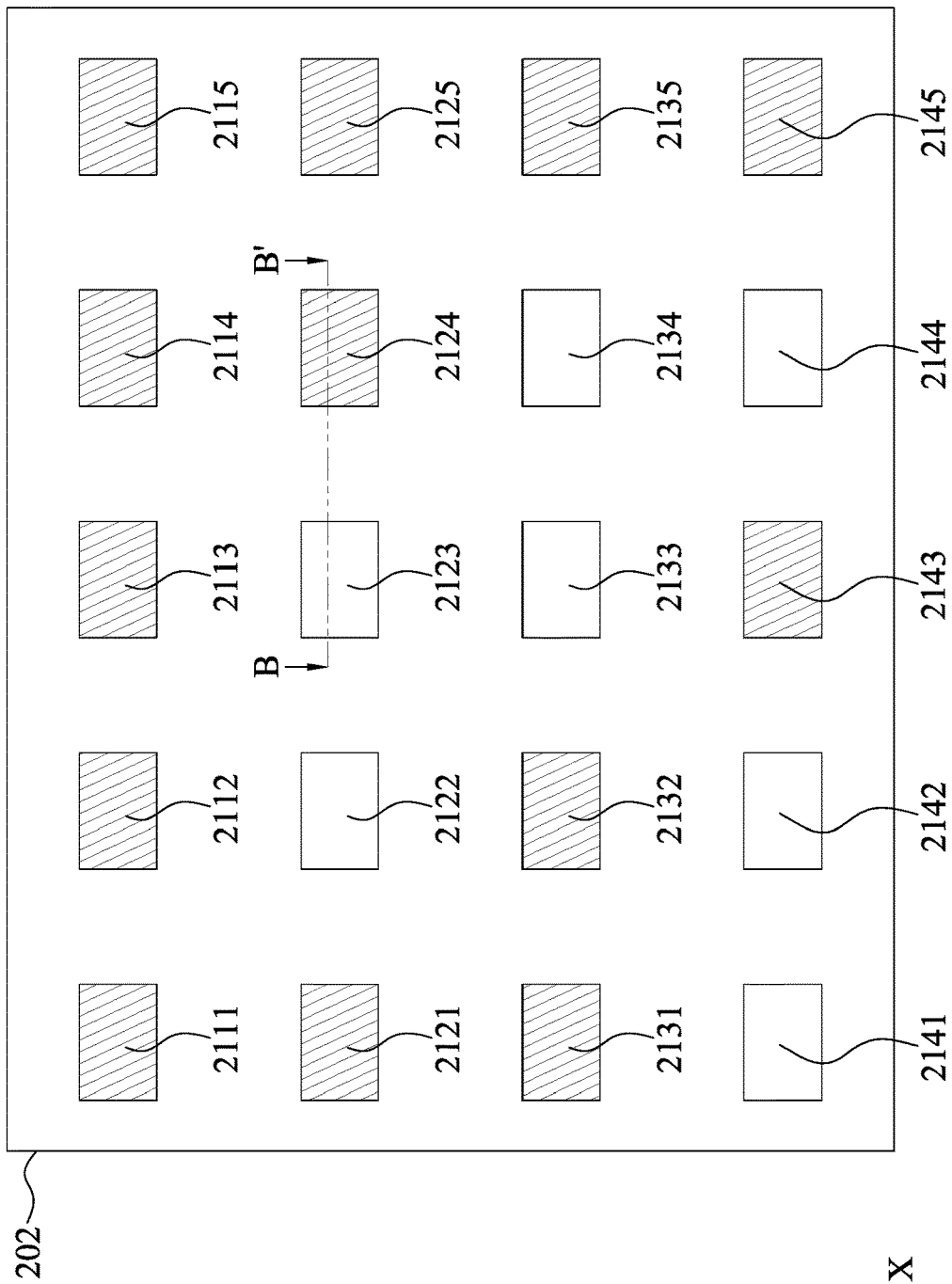
Figure 10B:
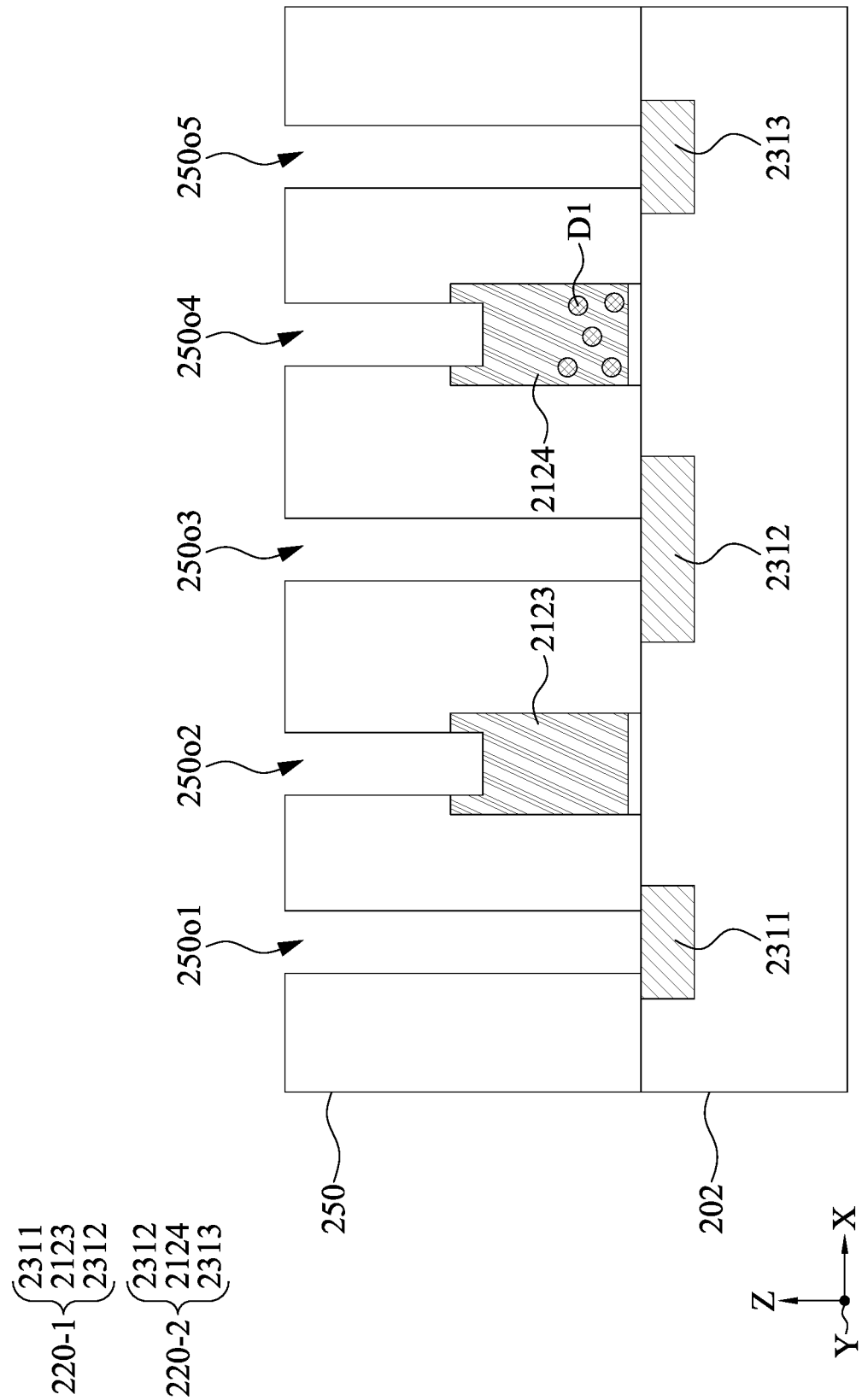

Referring to FIG. 10A and FIG. 10B, the reticle E1 and the photosensitive material M1 can be removed. The gate electrodes 2111-2145 can be exposed. The gate electrodes doped with dopants D1 can be grouped as the "gate electrode 210-1."

Figure 11A:
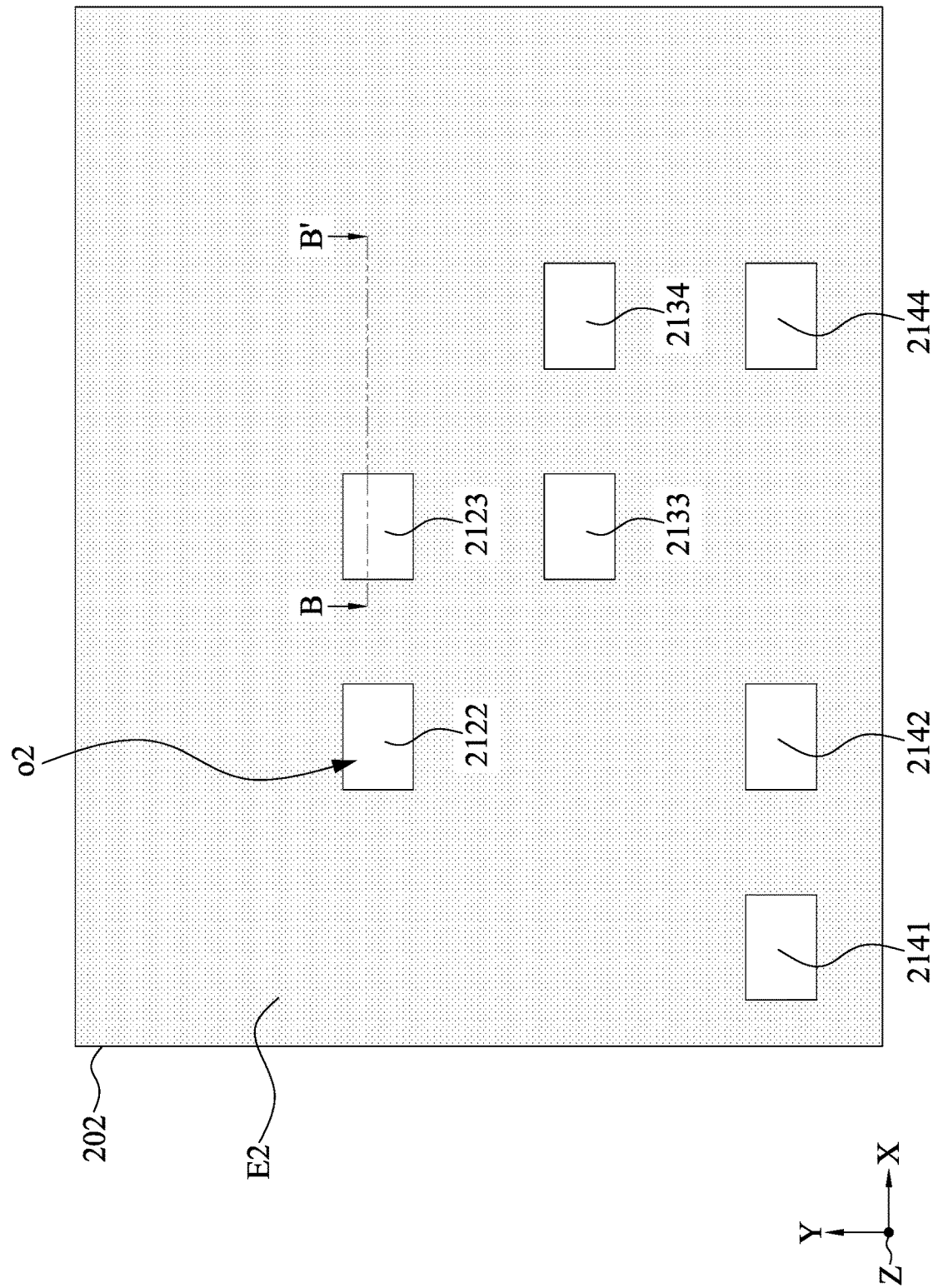
Figure 11B:
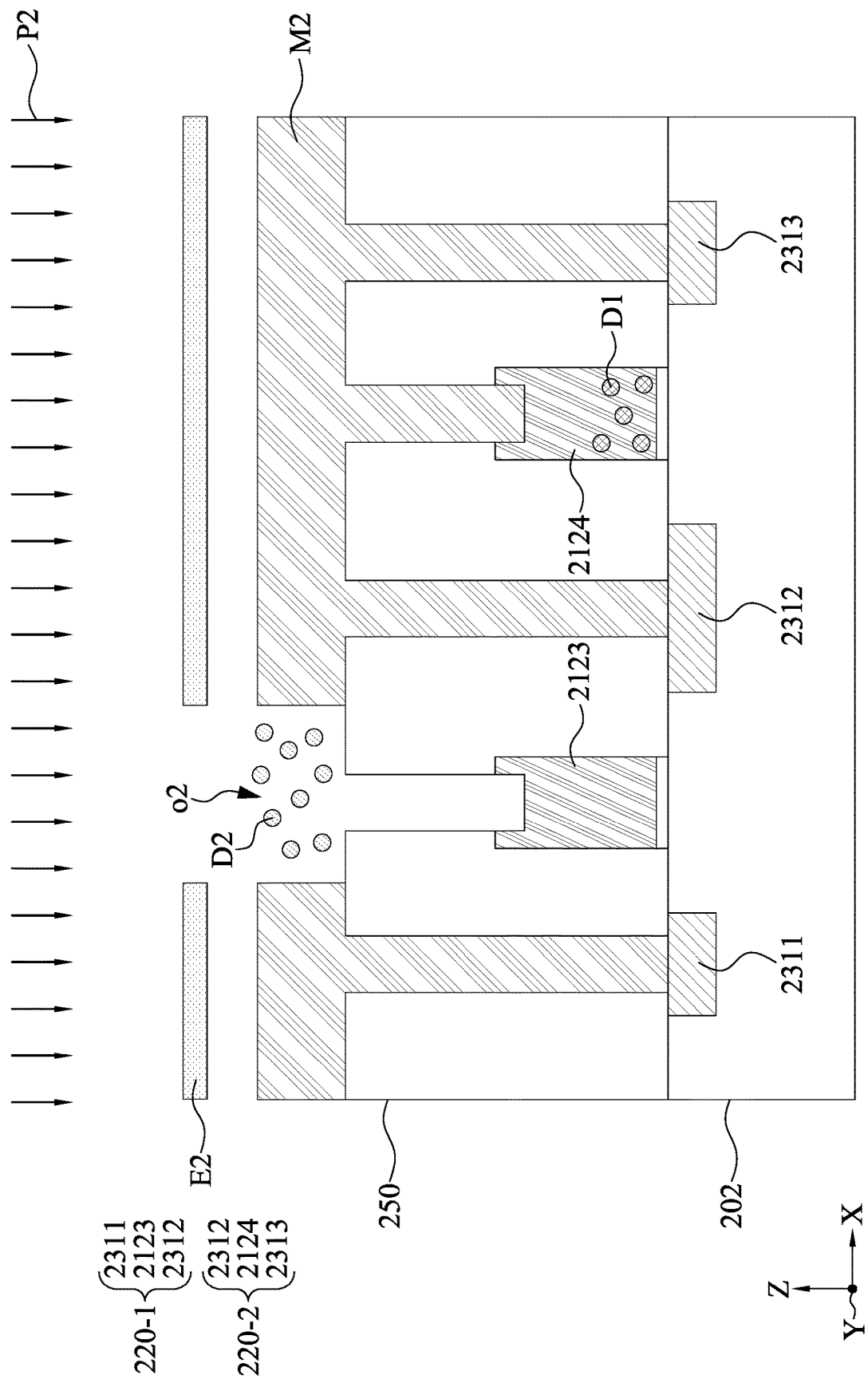

Referring to FIG. 11A and FIG. 11B, a reticle E2 is provided. In some embodiments, the pattern of the reticle E2 can be different from the pattern of the reticle E1. The reticle E2 exposes a portion of the gate electrodes, such as the gate electrodes 2122, 2123, 2133, 2134, 2141, 2142, and 2144.

The other portion of the gate electrodes, such as gate electrodes 2111, 2112, 2113, 2114, 2115, 2121, 2124, 2125, 2131, 2132, 2135, 2143, and 2145, doped with dopants D1 are covered by the reticle E2.

In some embodiments, a photosensitive material M2 can be formed over the dielectric layer 250. The photosensitive material M2 can include a negative-tone photoresist or a positive-tone photoresist. The photosensitive material M2 can be exposed through the reticle E2, forming openings o2 to expose the gate electrodes 2122, 2123, 2133, 2134, 2141, 2142, and 2144. A doping process P2 can be performed to dope the gate electrodes 2122, 2123, 2133, 2134, 2141, 2142, and 2144 with dopants D2. In some embodiments, the dopant D2 can be of a second conductive type, such as p type. The dopants D2 can be doped into the gate electrodes 2122, 2123, 2133, 2134, 2141, 2142, and 2144 through the openings o2. In some embodiments, the openings 250o1, 250o3, 250o4, and 250o5 can be filled with the photosensitive material M2 or other suitable materials.

Figure 12A:
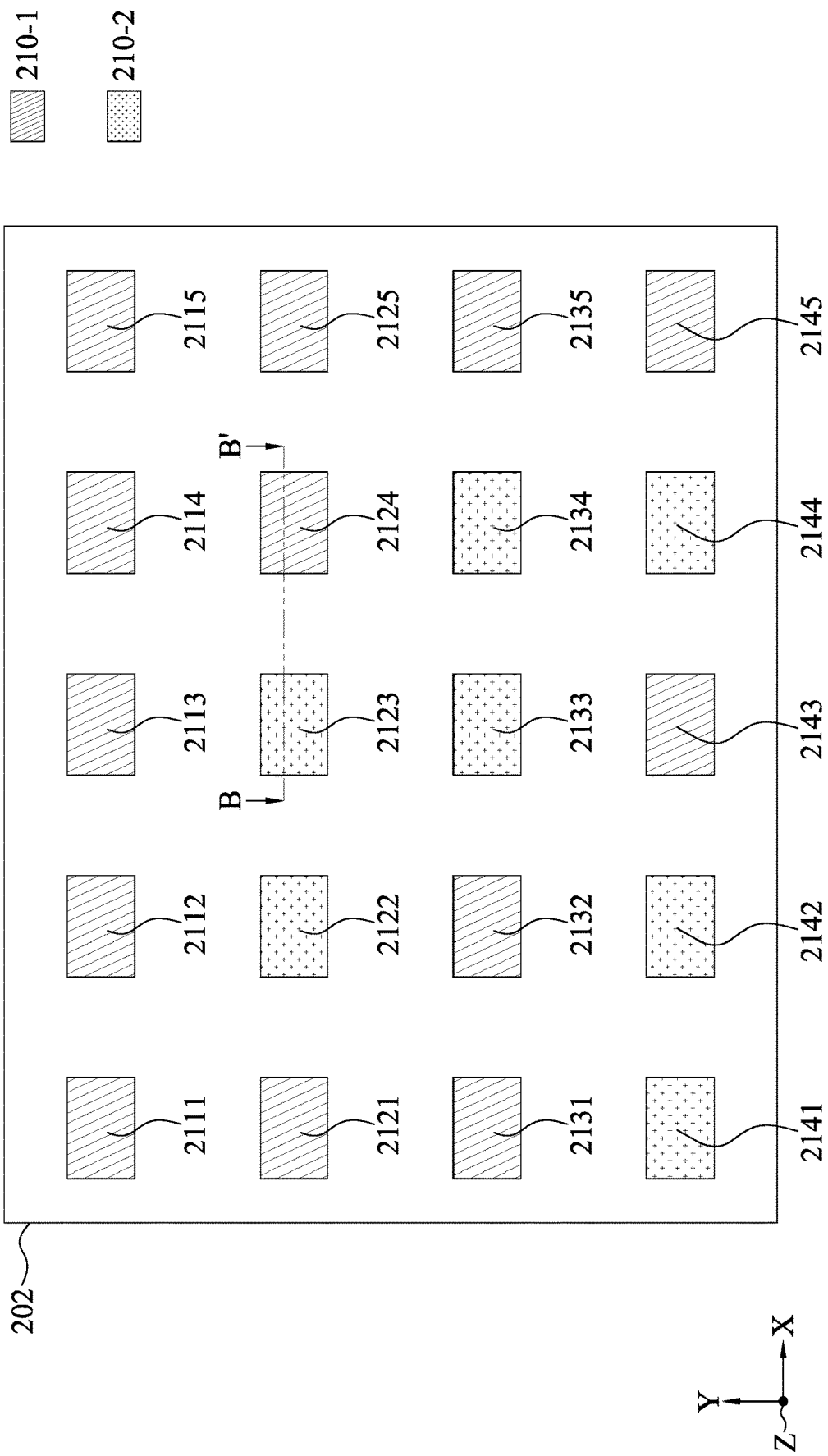
Figure 12B:
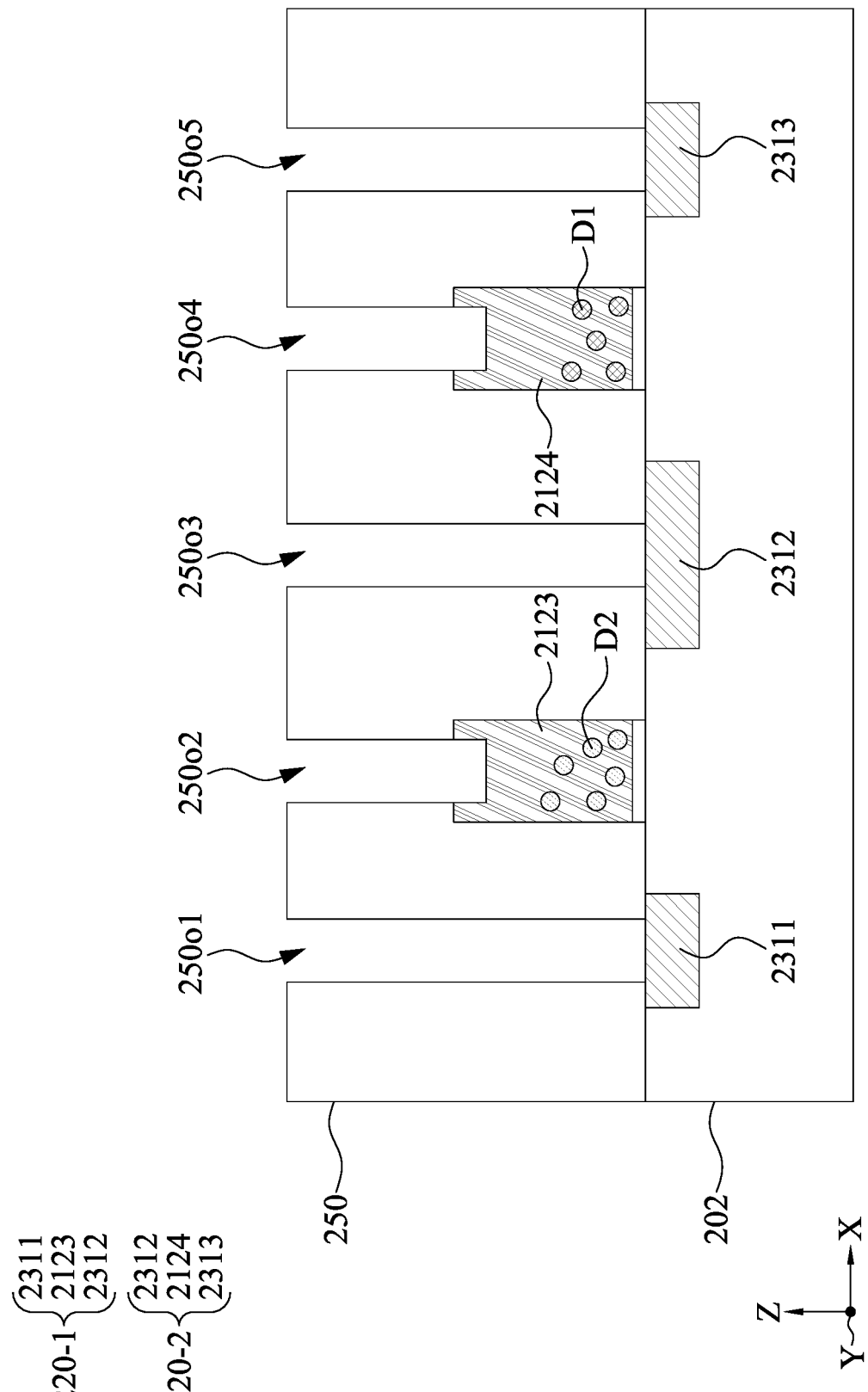

Referring to FIG. 12A and FIG. 12B, the reticle E2 and the photosensitive material M2 can be removed. The gate electrodes 2111-2145 can be exposed. The gate electrodes doped with dopants D2 can be grouped as the "gate electrode 210-2."

Figure 13A:
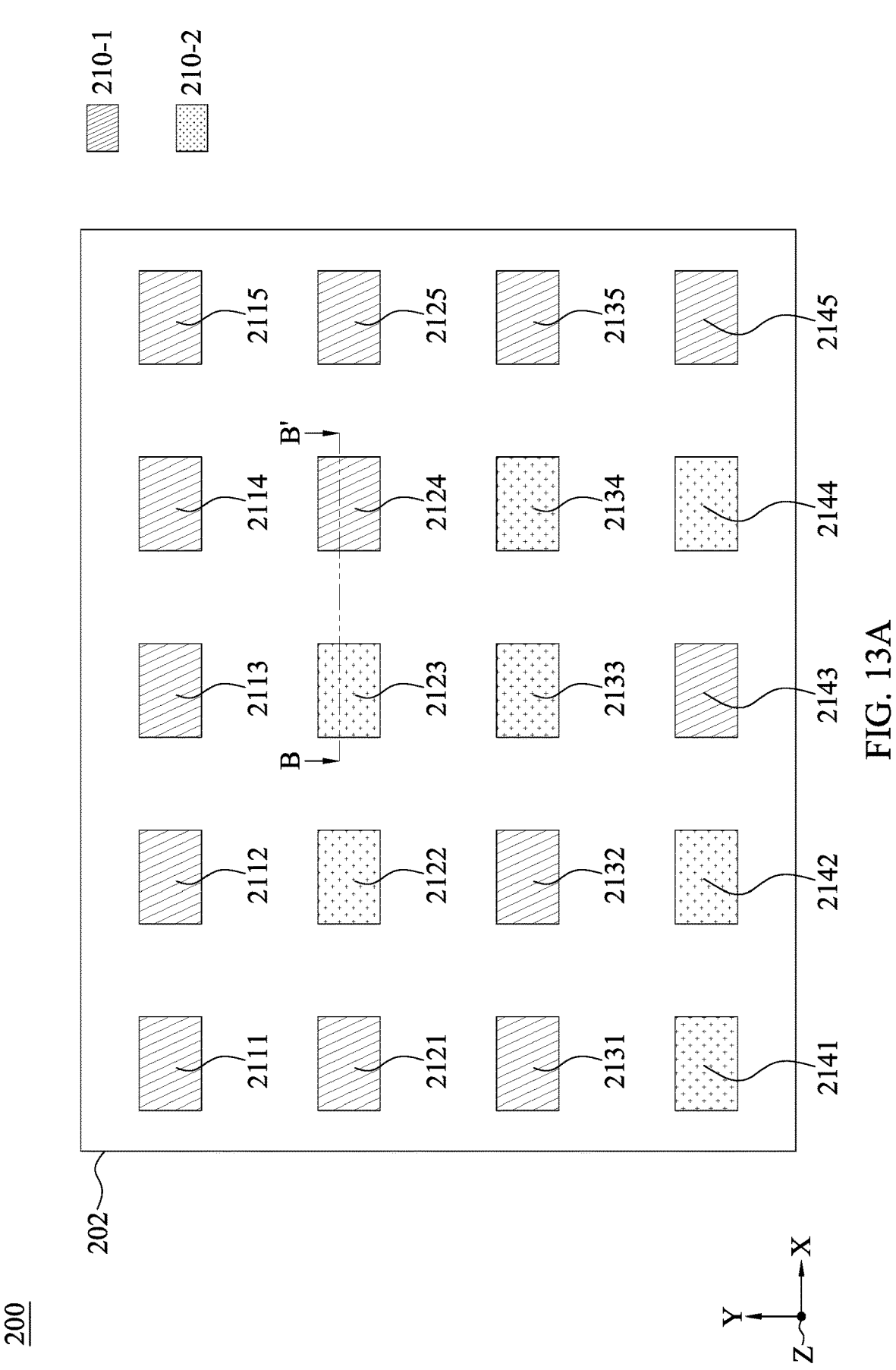
Figure 13B:
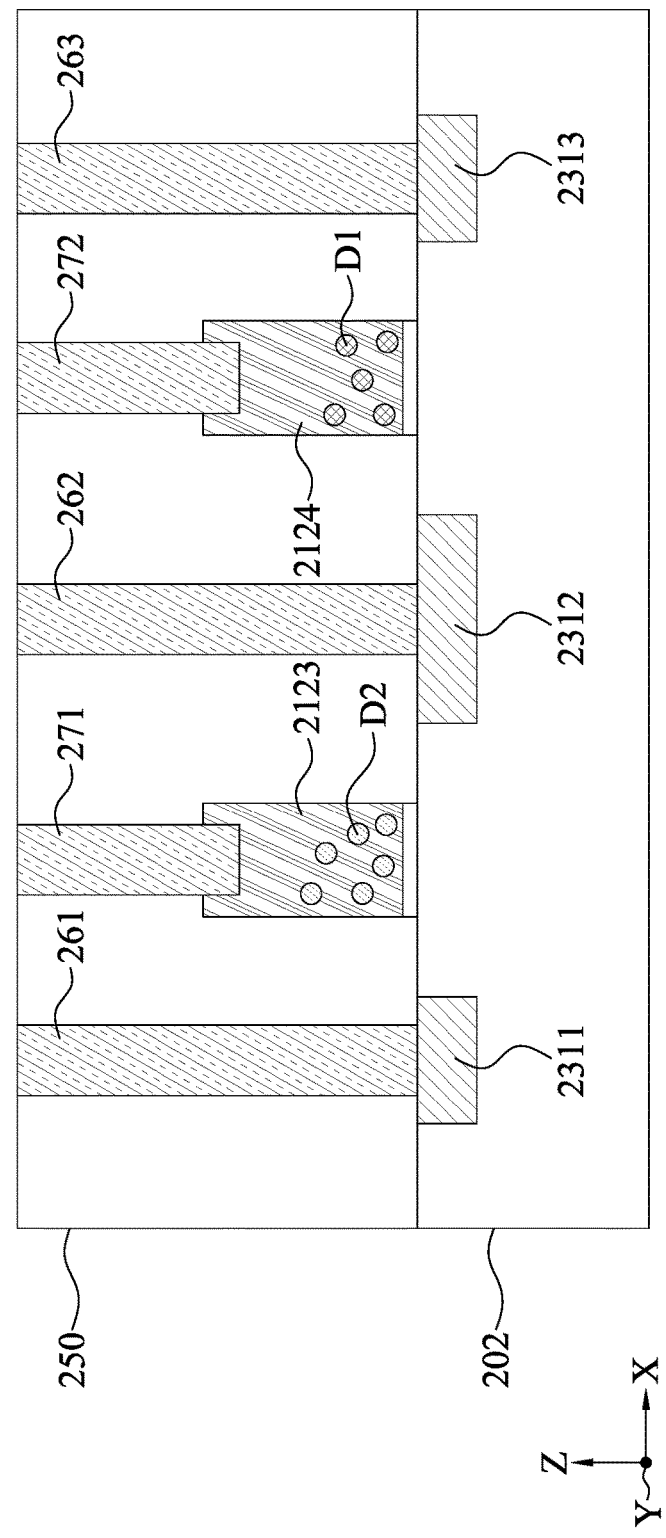

Referring to FIG. 13A and FIG. 13B, conductive contacts 261, 262, 263, 271, and 272 can be formed to fill the openings 250o1-250o5, thereby producing the semiconductor device 200. The conductive contacts 261, 262, 263, 271, and 272 can be formed by, for example, a PVD process.

The stages shown in FIGS. 6A-13A and 6B-13B can be utilized to determine an arrangement (or distribution) of the gate electrodes 210-1 and 210-2, thereby determining an arrangement (or distribution) of logic value "1" or "0." As a result, the semiconductor device 200 can be configured to generate a code for identification.

One aspect of the present disclosure provides a semiconductor device. The semiconductor device includes a substrate, a first gate electrode, and a second gate electrode. The first gate electrode is disposed on the substrate. The first gate electrode is doped with a first dopant of a first conductive type. The second gate electrode is disposed on the substrate. The second gate electrode is doped with a second dopant of a second conductive type different from the first conductive type.

Another aspect of the present disclosure provides another semiconductor device. The semiconductor device includes a substrate, a plurality of first gate electrodes and a plurality of second gate electrodes. The plurality of first gate electrodes and the plurality of second gate electrodes are arranged in an array, at least one of which is disposed on the substrate. The first gate electrodes are doped with first dopants of a first conductive type. The second gate electrodes are doped with second dopants of a second conductive type different from the first conductive type.

Another aspect of the present disclosure provides a method for manufacturing a semiconductor device. The method includes providing a substrate, forming a plurality of gate electrodes on the substrate, doping a first portion of the plurality of gate electrodes with a first dopant of a first conductive type, and doping a second portion of the plurality of gate electrodes with a second dopant of a second conductive type different from the first conductive type.

The embodiments of the present disclosure provide a semiconductor device with gate electrodes with dopants of different conductive types, thereby modifying the threshold voltage of a transistor. Thus, when transistors including gate electrodes, with dopants of different conductive types, are turned on, different currents can be measured, determining a lower logic value "0" and a higher logic value "1." As a result, the semiconductor device of the present disclosure can be configured to generate a code for identification.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate;
   a first gate electrode disposed on the substrate, wherein the first gate electrode is doped with a first dopant of a first conductive type;
   a second gate electrode disposed on the substrate, wherein the second gate electrode is doped with a second dopant of a second conductive type different from the first conductive type; and
   a first doped region, a second doped region, and a third doped region disposed in the substrate;
   wherein the first gate electrode is located between the first doped region and the second doped region, wherein a distance between the first doped region and the second doped region is larger than a width of the first gate electrode, such that the first gate electrode is contactless with the first doped region and the second doped region;
   wherein the second gate electrode is located between the second doped region and the third doped region, wherein a distance between the second doped region and the third doped region is larger than a width of the second gate electrode, such that the second gate electrode is contactless with the second doped region and the third doped region;
   wherein the first doped region, the first gate electrode, the second doped region, the second gate electrode, and the third doped region are arranged in sequence along a first direction, wherein the first doped region, the first gate electrode, the second doped region, the second gate electrode, and the third doped region are spaced apart with each other along the first direction in a contactless manner;
   wherein the first doped region, the first gate electrode, and the second doped region collectively define a first transistor;
   wherein the second doped region, the second gate electrode, and the third doped region collectively define a second transistor;

wherein a first area of the first doped region is smaller than a second area of the second doped region in a top view, the second doped region is connected to ground, and the second doped region serves a shared source or a shared drain of the first transistor and the second transistor.

2. The semiconductor device of claim 1, further comprising a first gate dielectric and a second gate dielectric disposed on the substrate, wherein the first gate electrode and the second gate electrode are respectively disposed on the first gate dielectric and the second gate dielectric, wherein a width of the first gate dielectric is equal to the width of first gate electrode, wherein a width of the second gate dielectric is equal to the width of second gate electrode, wherein the first gate electrode comprises a charge trapping material, wherein the first gate dielectric and the second gate dielectric are free from being doped with the first dopant and the second dopant.

3. The semiconductor device of claim 1, wherein the first transistor has a first threshold voltage, and the second transistor has a second threshold voltage different from the first threshold voltage.

4. The semiconductor device of claim 3, wherein the first transistor has a first channel region in the substrate between the first doped region and the second doped region, wherein the first channel region is free from being doped with the first dopant or the second dopant, wherein a length of the first channel region is larger than the width of the first gate electrode.

5. The semiconductor device of claim 3, wherein the first transistor has a first channel region in the substrate between the first doped region and the second doped region, wherein the second transistor has a second channel region in the substrate between the second doped region and the third doped region, wherein at least one of the first dopant and the second dopant is free from being doped in both the first channel region and the second doped region, wherein a length of the first channel region is larger than the width of the first gate electrode, wherein a length of the second channel region is larger than the width of the second gate electrode.

6. A semiconductor device, comprising:
a substrate;
a first gate electrode disposed on the substrate, wherein the first gate electrode is doped with a first dopant of a first conductive type;
a second gate electrode disposed on the substrate, wherein the second gate electrode is doped with a second dopant of a second conductive type different from the first conductive type;
a first doped region, a second doped region, and a third doped region disposed in the substrate; and
a third gate electrode disposed on the substrate, wherein the third gate electrode has the second conductive type, the first gate electrode is aligned with the second gate electrode along a first direction, and the first gate electrode is aligned with the third gate electrode along a second direction different from the first direction;
wherein the first gate electrode is located between the first doped region and the second doped region, wherein a distance between the first doped region and the second doped region is larger than a width of the first gate electrode, such that the first gate electrode is contactless with the first doped region and the second doped region;
wherein the second gate electrode is located between the second doped region and the third doped region, wherein a distance between the second doped region and the third doped region is larger than a width of the second gate electrode, such that the second gate electrode is contactless with the second doped region and the third doped region;
wherein a distance between the first gate electrode and the second gate electrode along the first direction is different from a distance between the first gate electrode and its colinear second gate electrode along the second direction.

7. The semiconductor device of claim 6, further comprising:
a fourth gate electrode disposed on the substrate, wherein the fourth gate electrode has the first conductive type, the fourth gate electrode is aligned with the third gate electrode along the first direction, and the fourth gate electrode is aligned with the second gate electrode along the second direction;
wherein a distance between the fourth gate electrode and the third gate electrode along the first direction is different from a distance between the fourth gate electrode and its colinear third gate electrode along the second direction.

8. The semiconductor device of claim 6, further comprising:
a fourth gate electrode disposed on the substrate, wherein the fourth gate electrode has the second conductive type, the fourth gate electrode is aligned with the third gate electrode along the first direction, and the fourth gate electrode is aligned with the second gate electrode along the second direction;
wherein a distance between the fourth gate electrode and the third gate electrode along the first direction is different from a distance between the fourth gate electrode and its colinear third gate electrode along the second direction.

9. A semiconductor device, comprising:
a substrate;
a first gate electrode disposed on the substrate, wherein the first gate electrode is doped with a first dopant of a first conductive type;
a second gate electrode disposed on the substrate, wherein the second gate electrode is doped with a second dopant of a second conductive type different from the first conductive type;
a first doped region, a second doped region, and a third doped region disposed in the substrate; and
a third gate electrode disposed on the substrate, wherein the third gate electrode has the first conductive type, the first gate electrode is aligned with the second gate electrode along a first direction, and the first gate electrode is aligned with the third gate electrode along a second direction different from the first direction;
wherein the first gate electrode is located between the first doped region and the second doped region, wherein a distance between the first doped region and the second doped region is larger than a width of the first gate electrode, such that the first gate electrode is contactless with the first doped region and the second doped region;
wherein the second gate electrode is located between the second doped region and the third doped region, wherein a distance between the second doped region and the third doped region is larger than a width of the second gate electrode, such that the second gate electrode is contactless with the second doped region and the third doped region;

wherein a distance between the first gate electrode and the second gate electrode along the first direction is different from a distance between the first gate electrode and its colinear second gate electrode along the second direction.

10. The semiconductor device of claim 9, further comprising:
a fourth gate electrode disposed on the substrate, wherein the fourth gate electrode has the first conductive type, the fourth gate electrode is aligned with the third gate electrode along the first direction, and the fourth gate electrode is aligned with the second gate electrode along the second direction;
wherein a distance between the fourth gate electrode and the third gate electrode along the first direction is different from a distance between the fourth gate electrode and its colinear third gate electrode along the second direction.

11. The semiconductor device of claim 9, further comprising:
a fourth gate electrode disposed on the substrate, wherein the fourth gate electrode has the second conductive type, the fourth gate electrode is aligned with the third gate electrode along the first direction, and the fourth gate electrode is aligned with the second gate electrode along the second direction;
wherein a distance between the fourth gate electrode and the third gate electrode along the first direction is different from a distance between the fourth gate electrode and its colinear third gate electrode along the second direction.

* * * * *